US010147663B2

(12) United States Patent
Tani et al.

(10) Patent No.: US 10,147,663 B2
(45) Date of Patent: Dec. 4, 2018

(54) CERAMIC CIRCUIT BOARD AND ELECTRONIC DEVICE

(71) Applicant: NGK INSULATORS, LTD., Nagoya (JP)

(72) Inventors: Makoto Tani, Inazawa (JP); Yoshihiro Tanaka, Nagoya (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 239 days.

(21) Appl. No.: 15/040,405

(22) Filed: Feb. 10, 2016

(65) Prior Publication Data

US 2016/0163617 A1 Jun. 9, 2016

Related U.S. Application Data

(63) Continuation of application No. PCT/JP2014/071473, filed on Aug. 15, 2014.

(30) Foreign Application Priority Data

Aug. 16, 2013 (JP) .................................. 2013-169260

(51) Int. Cl.
*H05K 1/03* (2006.01)
*H01L 23/367* (2006.01)
(Continued)

(52) U.S. Cl.
CPC ........ *H01L 23/3675* (2013.01); *C04B 35/645* (2013.01); *C04B 37/025* (2013.01); *H01L 23/367* (2013.01); *H01L 23/3735* (2013.01); *H01L 23/492* (2013.01); *H01L 23/49838* (2013.01); *H01L 23/49894* (2013.01); *H01L 23/562* (2013.01); *H05K 1/0271* (2013.01); *H05K 1/0306* (2013.01); *H05K 1/181* (2013.01);
(Continued)

(58) Field of Classification Search
CPC . H01L 23/427; H01L 23/467; H01L 23/4093; G06F 1/20
USPC ........................ 361/700–710, 782–783, 760; 174/258–261; 257/702–704
See application file for complete search history.

(56) References Cited

U.S. PATENT DOCUMENTS 5,731,067 A 3/1998 Asai et al.
6,033,787 A 3/2000 Nagase et al.
(Continued)

FOREIGN PATENT DOCUMENTS

EP 0 766 307 A1 4/1997
EP 0 874 399 A1 10/1998
(Continued)

OTHER PUBLICATIONS

International Search Report and Written Opinion (Application No. PCT/JP2014/071473) dated Oct. 28, 2014.
(Continued)

*Primary Examiner* — Tuan T Dinh
(74) *Attorney, Agent, or Firm* — Burr & Brown, PLLC

(57) ABSTRACT

A ceramic circuit board includes a ceramic substrate, a first metal plate bonded to a front surface of the ceramic substrate, and a member bonded to a front surface side of the metal plate. The member is made up from a material which exhibits a lower coefficient of thermal expansion than that of the first metal plate, and which exhibits a higher Young's modulus than that of the first metal plate.

10 Claims, 20 Drawing Sheets

(51) Int. Cl.
*H01L 23/373* (2006.01)
*C04B 35/645* (2006.01)
*C04B 37/02* (2006.01)
*H01L 23/492* (2006.01)
*H01L 23/498* (2006.01)
*H01L 23/00* (2006.01)
*H05K 1/02* (2006.01)
*H05K 1/18* (2006.01)

(52) U.S. Cl.
CPC .. *C04B 2237/125* (2013.01); *C04B 2237/127* (2013.01); *C04B 2237/368* (2013.01); *C04B 2237/407* (2013.01); *C04B 2237/704* (2013.01); *C04B 2237/706* (2013.01); *C04B 2237/86* (2013.01); *H01L 2924/0002* (2013.01); *H05K 2201/068* (2013.01)

(56) References Cited

U.S. PATENT DOCUMENTS

| | | | |
|---|---|---|---|
| 6,232,657 | B1 | 5/2001 | Komorita et al. |
| 8,749,052 | B2 * | 6/2014 | Schulz-Harder .... H01L 23/3735 257/675 |
| 9,066,433 | B2 | 6/2015 | Kuromitsu et al. |
| 2004/0099948 | A1 * | 5/2004 | Stockmeier ......... H01L 23/3121 257/728 |
| 2015/0342027 | A1 | 11/2015 | Feichtinger et al. |

FOREIGN PATENT DOCUMENTS

| | | |
|---|---|---|
| JP | 2003-086747 A1 | 3/2003 |
| JP | 2006-041256 A1 | 2/2006 |
| JP | 2006-066595 A1 | 3/2006 |
| JP | 2006-294890 A1 | 10/2006 |
| JP | 3847954 B2 | 11/2006 |
| JP | 2007-095942 A1 | 4/2007 |
| JP | 2011-222669 A1 | 11/2011 |
| JP | 2012-074591 A1 | 4/2012 |
| JP | 2014-053441 A1 | 3/2014 |
| WO | 2013/024813 A1 | 2/2013 |
| WO | 2014/095587 A1 | 6/2014 |

OTHER PUBLICATIONS

Extended European Search Report (Application No. 14160452.0) dated Dec. 10, 2014.
European Office Action, European Application No. 14160452.0, dated May 15, 2018 (5 pages).

* cited by examiner

CERAMIC CIRCUIT BOARD AND ELECTRONIC DEVICE

CROSS-REFERENCE TO RELATED APPLICATIONS

This application is a Continuation of International Application No. PCT/JP2014/071473 filed on Aug. 15, 2014, which is based upon and claims the benefit of priority from Japanese Patent Application No. 2013-169260 filed on Aug. 16, 2013, the contents all of which are incorporated herein by reference.

BACKGROUND OF THE INVENTION

Field of the Invention

The present invention relates to a ceramic circuit board and an electronic device, and in particular, relates to a ceramic circuit board, which is suitable for use as an insulating substrate for a power semiconductor, for example, of a bipolar transistor, a power MOSFET (metal-oxide-semiconductor field-effect transistor), an IGBT (Insulated Gate Bipolar Transistor) or the like, as well as to an electronic device utilizing such a ceramic circuit board.

Description of the Related Art

In recent years, for example as shown in FIGS. 19A and 19B, a ceramic circuit board 100 having a first metal plate 104 on a front surface 102a of a ceramic substrate 102, and a second metal plate 106 on a rear surface 102b of the ceramic substrate 102, has been used as an insulating substrate for a power semiconductor (for example, see Japanese Patent No 3847954). In addition, an electronic device 112 may be constituted by mounting a power semiconductor 108, for example, through a solder layer 110, on the first metal plate 104.

In the ceramic circuit board 100 on which the power semiconductor 108 is mounted, for suppressing generation of heat, a high heat dissipation property is required. Accordingly, in general, for use as the first metal plate 104 and the second metal plate 106, metal plates that exhibit high thermal conductivity, including Cu (copper) and Al (aluminum), are selected. For the ceramic substrate 102, a ceramic substrate that exhibits high thermal conductivity, such as AlN (aluminum nitride) or $Si_3N_4$ (silicon nitride), is selected. A heat dissipating substrate, in which the aforementioned materials are bonded directly or are bonded through a brazing material, is used as a ceramic circuit board 100.

In particular, with the ceramic circuit board 100, in which a first metal plate 104 and a second metal plate 106 constituted from Cu, and a ceramic substrate 102 constituted from $Si_3N_4$ are joined through a brazing material such as an Ag—Cu (silver/copper) type brazing material, due to the ceramic, which possesses high strength, and Cu, which exhibits high thermal conductivity, the ceramic circuit board 100 is superior in terms of heat cycle characteristics and thus can be utilized advantageously. Further, a heat sink, for example, may be bonded to an end surface of the second metal plate 106.

SUMMARY OF THE INVENTION

Incidentally, recently, needs have arisen for miniaturization and an improvement in power density of the power semiconductor 108, or to simplify a cooling system thereof by improving heat dissipation. If the power density of the power semiconductor 108 is enhanced, the amount of heat generated thereby increases, and if the cooling system is simplified, heat dissipation thereof tends to decrease. Therefore, to be responsive to the aforementioned needs, there has been a demand for further improvements in heat dissipation characteristics for the ceramic circuit board 100.

Thus, as a method for improving heat dissipation, for example as shown in FIG. 20, it may be considered to increase the thicknesses t1 and t2 of the first metal plate 104 and the second metal plate 106, so as to be greater in thickness than the thicknesses thereof according to the conventional technique (see FIG. 19A).

Ordinarily, in the case that the ceramic circuit board 100 according to the conventional technique shown in FIG. 19A is used, in accordance with the heat cycle thereof during usage, a thermal stress accompanying the difference in thermal expansion between the first metal plate 104 and the ceramic substrate 102 is generated at an interface 114a between the first metal plate 104 and the ceramic substrate 102. In this case, on the front surface 102a of the ceramic substrate 102, a mixed state is brought about between the aforementioned interface 114a to which thermal stress is applied, and portions in the vicinity thereof to which thermal stress is not applied. Similarly, a thermal stress accompanying the difference in thermal expansion between the second metal plate 106 and the ceramic substrate 102 is generated at an interface 114b between the second metal plate 106 and the ceramic substrate 102. In this case as well, on the rear surface 102b of the ceramic substrate 102, a mixed state is brought about between the aforementioned interface 114b to which thermal stress is applied, and portions in the vicinity thereof to which thermal stress is not applied.

Accordingly, as shown in FIG. 20, if the thickness t1 of the first metal plate 104 and the thickness t2 of the second metal plate 106 are increased, due to the fact that the first metal plate 104 and the second metal plate 106 become greater in volume, thermal stresses, which are generated at the interface 114a between the first metal plate 104 and the ceramic substrate 102 as well as at the interface 114b between the second metal plate 106 and the ceramic substrate 102, also increase. For this reason, there is a concern over problems such as cracks 116 occurring in the ceramic substrate 102 or splitting of the ceramic substrate 102, as a result of the heat cycle during usage. More specifically, within the front surface of the ceramic substrate 102, a concern exists that cracks 116 will be introduced from a border portion, where compressive stresses and tensile stresses are concentrated at the border between the interface where thermal stress is applied and portions in the vicinity thereof where thermal stress is not applied.

In this manner, with the ceramic circuit board 100 according to the conventional technique, a problem exists in that an improvement in heat dissipation cannot be realized, and thus the aforementioned needs cannot be responded to.

The present invention has been made in order to address the aforementioned problems, and has the object of providing a ceramic circuit board and an electronic device, which can alleviate thermal stresses that occur at an interface between metal plates and a ceramic substrate, even in the case that the metal plates, which are provided at least on a side on which a power semiconductor is mounted, are increased in thickness, which can suppress the occurrence of warping, and in which heat dissipation can be enhanced.

[1] A ceramic circuit board according to a first aspect of the present invention includes a ceramic substrate, a metal plate (referred to as a "first metal plate") bonded to a front surface of the ceramic substrate, and a member bonded to a front surface side of the first metal plate. The member is made up from a material which exhibits a lower coefficient of thermal expansion than that of the metal plate, and which exhibits a higher Young's modulus than that of the metal plate.

Consequently, due to the heat cycle during operation thereof, the following thermal stresses are generated.

(i) A thermal stress accompanying a difference in thermal expansion between the first metal plate and the ceramic substrate is generated at an interface (referred to below as an "interface 1") between the first metal plate and the ceramic substrate.

(ii) A thermal stress accompanying a difference in thermal expansion between the first metal plate and the member is generated at an interface (referred to below as an "interface 2") between the first metal plate and the member.

With the conventional technique, thermal stress is generated at the interface 1 between the first metal plate and the ceramic substrate, such that compressive stresses and tensile stresses are concentrated at the boundary between the interface 1 and portions in the vicinity thereof. However, with the present invention, in particular, due to generation of the thermal stress indicated by (ii) above, the thermal stress indicated by (i) is alleviated (reduced). More specifically, thermal stresses due to the heat cycle are generated and distributed over the interface 1 and the interface 2, and within the surface of the ceramic substrate, compressive stresses and tensile stresses, which are applied concentratively at the boundary between the interface 1 and portions in the vicinity thereof, are alleviated, such that cracks or splitting of the ceramic substrate due to the heat cycle during usage thereof do not occur. Consequently, the thickness of the first metal plate can be increased, and the heat dissipation properties of the ceramic circuit board can be enhanced.

[2] In the first aspect of the invention, the member may be formed in an annular shape along an outer circumference of the front surface of the first metal plate.

[3] the first aspect of the present invention, a plurality of the members may be provided, the plural members being arranged along an outer circumference of the front surface of the first metal plate.

[4] In the first aspect of the present invention, two of the members may be bonded at linearly symmetric positions.

[5] In the first aspect of the present invention, a portion of the member may extend out in a transverse direction beyond an outer circumference of the front surface of the first metal plate. In this case, positional alignment when the member is bonded to the surface of the first metal plate is simplified, so that a reduction in man-hours, an improvement in yield, and an improvement in productivity can be achieved.

[6] In the first aspect of the present invention, entirety of the member may be bonded within the front surface of the first metal plate. In this case, the constituent material amount of the member can be kept to a minimum, and manufacturing cost can be reduced.

[7] In the first aspect of the present invention, a portion of the front surface of the first metal plate may include a recess therein, and the member may be bonded in the recess. In this case, the surface (surface of the first metal plate) on which the power semiconductor is mounted is approximately at the same height as the surface of the member, or is greater in height than the surface of the member. Therefore, mounting of the power semiconductor can be facilitated and improved.

[8] In the first aspect of the present invention, at least material properties and thicknesses of the member and the ceramic substrate are adjusted so as to suppress warping of the ceramic circuit board. Such a feature can be accomplished by adjusting the coefficients of thermal expansion, the Young's moduli, and thereby the respective thicknesses of the member and the ceramic substrate. For example, in the case that the Young's moduli of the member and the ceramic substrate are equal to each other, if the coefficient of thermal expansion of the member is less than that of the ceramic substrate, then the thickness of the member is made thinner than the ceramic substrate.

[9] A constituent material of the member may be a ceramic material, which is the same as the ceramic material of the ceramic substrate.

[10] In this case, the constituent material of the ceramic substrate may preferably be silicon nitride. Silicon nitride is preferably used since it exhibits high strength and toughness/tenacity as well as high thermal conductivity, and is highly resistant to cracks or splitting of the ceramic substrate due to the heat cycle.

[11] In the first aspect of the present invention, another metal plate (hereinafter referred to as a second metal plate) may be bonded to a rear surface of the ceramic substrate, and a thickness of the first metal plate may be greater than a thickness of the second metal plate.

In the foregoing manner, due to alleviation of thermal stresses at the interface 1, even if the thickness of the second metal plate is less than the thickness of the first metal plate, the occurrence of warping of the ceramic circuit board overall is suppressed, the occurrence of cracks or breaking off of the power semiconductor, which is attached by solder to the front surface of the ceramic circuit board, and the occurrence of cracks in the bonding layer can be avoided. Consequently, an improvement in heat dissipation can be achieved, and an advantage is brought about in that the ceramic circuit board can be made thin or low in profile.

[12] Further, in this case, an inequality $t2<ta<t1$ may be satisfied, where ta represents a thickness of the ceramic substrate, t1 represents the thickness of the first metal plate, and t2 represents the thickness of the second metal plate.

[13] An electronic device according to a second aspect of the present invention comprises a ceramic circuit board according to the aforementioned first aspect of the present invention, and a power semiconductor, which is mounted on the front surface of the first metal plate of the ceramic circuit board.

As described above, in accordance with the ceramic circuit board and the electronic device according to the present invention, thermal stresses that occur at an interface between metal plates and a ceramic substrate can be alleviated, even in the case that the metal plates, which are provided at least on a side on which a power semiconductor is mounted, are increased in thickness. Together therewith, the occurrence of warping can be suppressed, and heat dissipation can be enhanced.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Below, preferred embodiments of the ceramic circuit board according to the present invention will be described with reference to FIGS. 1A through 18C. In the present specification, the dash symbol "-" (or "to") shown in connection with numerical ranges implies that the numerical values appearing before and after the dash symbol include upper limit and lower limit values.

Figure 1A:
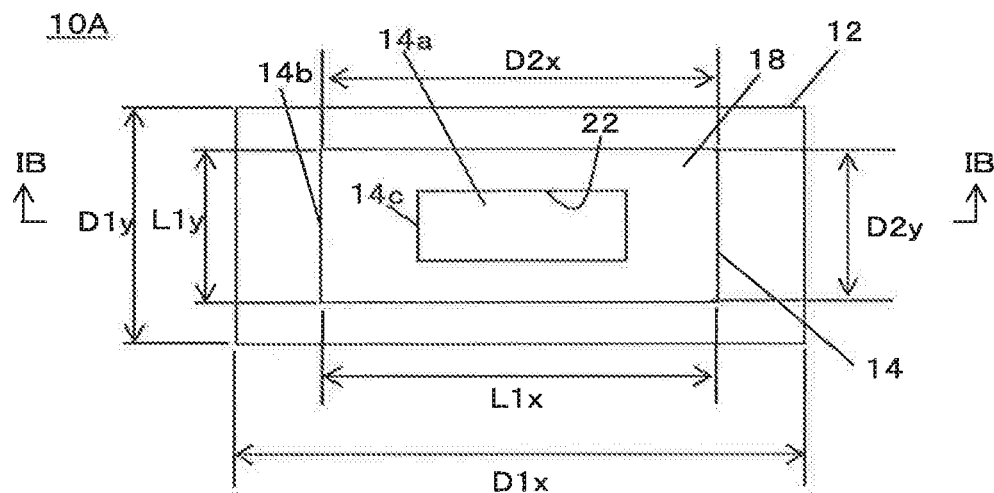
FIG. 1A is a plan view showing a ceramic circuit board (first ceramic circuit board) as viewed from an upper surface thereof according to a first embodiment of the present invention.
Figure 1B:
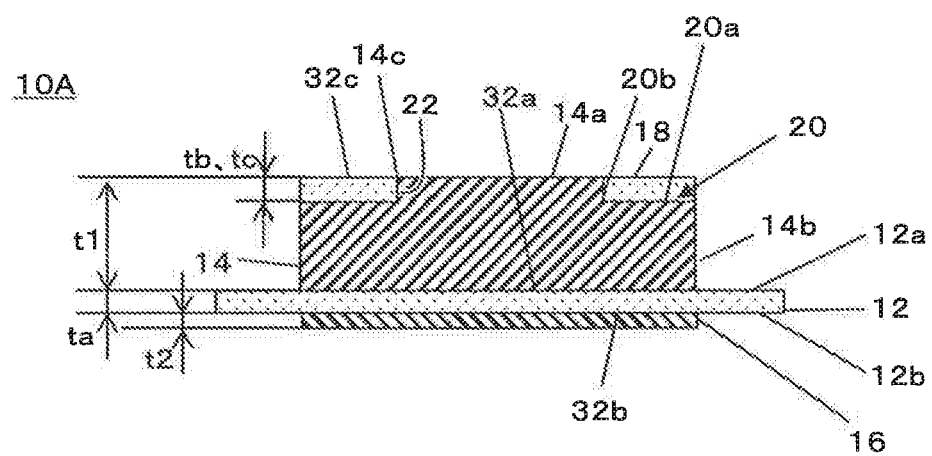
FIG. 1B is a cross-sectional view taken along line IB-IB in FIG. 1A.

First, as shown in FIGS. 1A and 1B, a ceramic circuit board (hereinafter referred to as a "first ceramic circuit board 10A") according to a first embodiment of the present invention includes a ceramic substrate 12, a first metal plate 14 bonded to a front surface 12a of the ceramic substrate 12, a second metal plate 16 bonded to a rear surface 12b of the ceramic substrate 12, and a member 18 bonded to a front surface 14a side of the first metal plate 14. The member 18 is made up from a material which exhibits a lower coefficient of thermal expansion than that of the first metal plate 14, and which exhibits a higher Young's modulus than that of the first metal plate 14.

The first metal plate 14 and the second metal plate 16 can be made up from metal plates that exhibit high thermal conductivity, including Cu (copper) and Al (aluminum). The ceramic substrate 12 can be made up from a ceramic material that exhibits high thermal conductivity, such as AlN (aluminum nitride) or $Si_3N_4$ (silicon nitride). Concerning the bond between the first metal plate 14 and the ceramic substrate 12, and the bond between the second metal plate 16 and the ceramic substrate 12, direct bonding, or bonding through a brazing material may be used. As a brazing material, a brazing material such as an Ag—Cu type brazing material or the like with an active metal added thereto, such as Ti (titanium) or the like, can be used. A specific constituent material of the member 18 and a bond thereof will be described later.

In addition, the first ceramic circuit board 10A includes a recess 20 in a portion of the front surface 14a of the first metal plate 14, and the member 18 is bonded while being embedded in the recess 20. The "front surface 14a of the first metal plate 14" is defined by a surface (e.g., the upper surface shown in FIG. 1B) on which a power semiconductor 26 (see FIG. 3A) is mounted, whereas the "rear surface" thereof is defined by a surface (e.g., the lower surface shown in FIG. 1B) opposite from the front surface 14a. The front surface of other members such as the ceramic substrate 12 or the like is defined by a surface (e.g., the upper surface thereof shown in FIG. 1B) on which the power semiconductor 26 is mounted, and the rear surface of such other members (e.g., the lower surface thereof shown in FIG. 1B) is defined by a surface opposite from the front surface.

The recess 20 is formed in an annular shape around an outer circumference 14c of the front surface 14a of the first metal plate 14. In particular, with the example shown in FIGS. 1A and 1B, the outer circumference 14c of the front surface 14a of the first metal plate 14 constitutes a portion of the recess 20. In other words, the recess 20 is formed to extend from the front surface 14a to a side surface 14b of the first metal plate 14. Therefore, the first metal plate 14 has a shape such that a shoulder portion thereof is cut out by the recess 20. Further, the member 18 is constituted by a single ring-shaped member, which is disposed along the annular shape of the recess 20. More specifically, the member 18 is bonded in an embedded fashion in the recess 20 of the first metal plate 14. Preferably, the member 18 is bonded through a brazing material such as an Ag—Cu type brazing material or the like from a bottom surface 20a of the recess 20 to a side surface 20b thereof.

Various shapes may be used for the respective outer shapes of the ceramic substrate 12, the first metal plate 14, and the second metal plate 16, although as viewed from the upper surface thereof in FIG. 1A, rectangular shapes are shown, respectively. The length D1y in the vertical direction and the length D1x in the horizontal (transverse) direction as viewed from the upper surface of the ceramic substrate 12 are longer than the length L1y in the vertical direction and the length L1x in the horizontal direction of the first metal plate 14. The lengths in the vertical direction and the lengths in the horizontal direction of both the first metal plate 14 and the second metal plate 16 are substantially the same, respectively. In the center of the member 18, a hole 22 is formed, which similarly is of a rectangular shape, with the front surface 14a of the first metal plate 14 being exposed through the hole 22.

Any of the following relationships may be adopted as the relationship between the length D2y in the vertical direction and the length D2x in the horizontal direction of the member 18 as the member 18 is viewed from the upper surface thereof, and the length L1y in the vertical direction and the length L1x in the horizontal direction of the first metal plate 14.

$$D2y=L1y, D2x=L1x \quad (A-1)$$

$$D2y>L1y, D2x=L1x \quad (A-2)$$

$$D2y<L1y, D2x=L1x \quad (A-3)$$

$$D2y=L1y, D2x>L1x \quad (A-4)$$

$$D2y>L1y, D2x>L1x \quad (A-5)$$

$$D2y<L1y, D2x>L1x \quad (A-6)$$

$$D2y=L1y, D2x<L1x \quad (A-7)$$

$$D2y>L1y, D2x<L1x \quad (A-8)$$

$$D2y<L1y, D2x<L1x \quad (A-9)$$

Among these relationships, the example of (A-1) is shown for the above-described first ceramic circuit board 10A (see FIGS. 1A and 1B).

Concerning the respective outer shapes of the ceramic substrate 12, the first metal plate 14, and the second metal plate 16, apart from the aforementioned rectangular shapes, other shapes such as circular shapes, elliptical shapes, track-like shapes, and various polygonal shapes such as triangles, pentagons, hexagons, or the like can be used.

Further, in the first ceramic circuit board 10A, the following relationships are satisfied:

$$ta \approx tb$$

$$t2 < ta < t1$$

where ta represents the thickness of the ceramic substrate 12, tb represents the thickness of the member 18, t1 represents the thickness of the first metal plate 14, and t2 represents the thickness of the second metal plate 16.

Figure 2A:
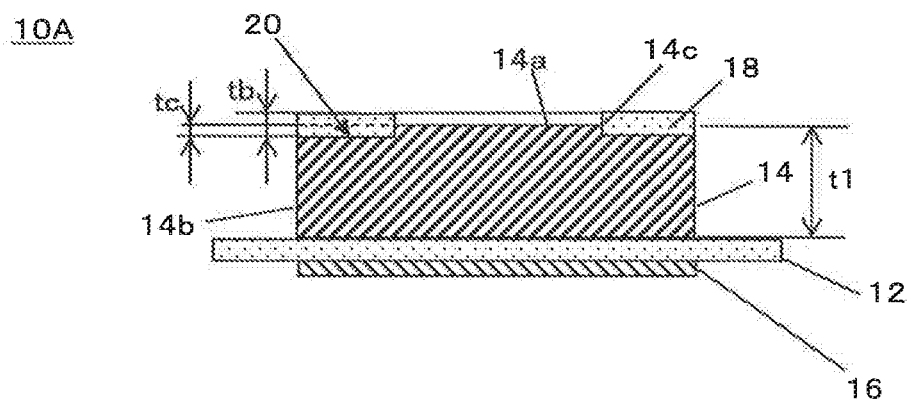
FIG. 2A is a vertical cross-sectional view showing a condition in which the depth of a recess in the first ceramic circuit board is shallower than the thickness of a member.
Figure 2B:
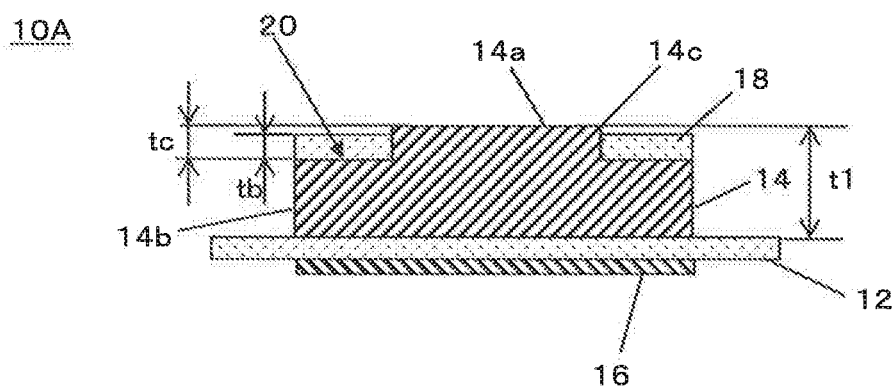
FIG. 2B is a vertical cross-sectional view showing a condition in which the depth of the recess in the first ceramic circuit board is deeper than the thickness of a member.

As shown in FIG. 1B, the depth tc of the recess 20 may be the same as the thickness tb of the member 18, or may be shallower than the thickness tb of the member 18 as shown in FIG. 2A. Alternatively, as shown in FIG. 2B, the depth tc of the recess 20 may be deeper than the thickness tb of the member 18.

Figure 3A:
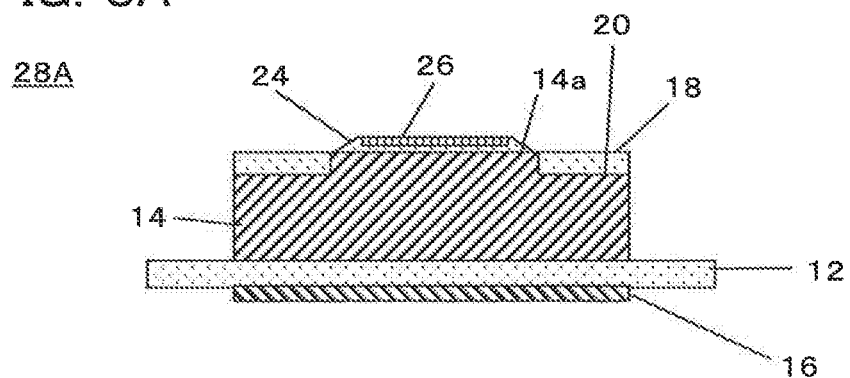
FIG. 3A is a vertical cross-sectional view showing an electronic device (first electronic device) according to the first embodiment.
Figure 3B:
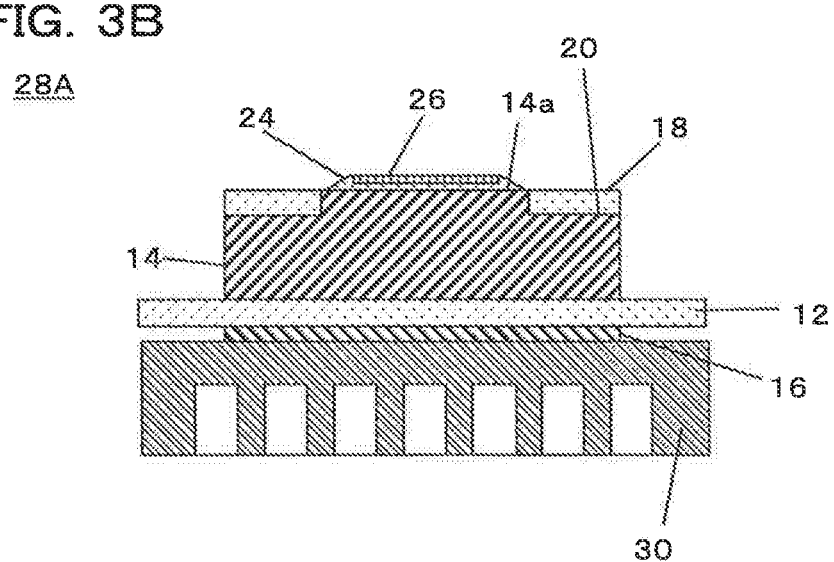
FIG. 3B is a vertical cross-sectional view showing another example of the first electronic device.
Figure 4A:
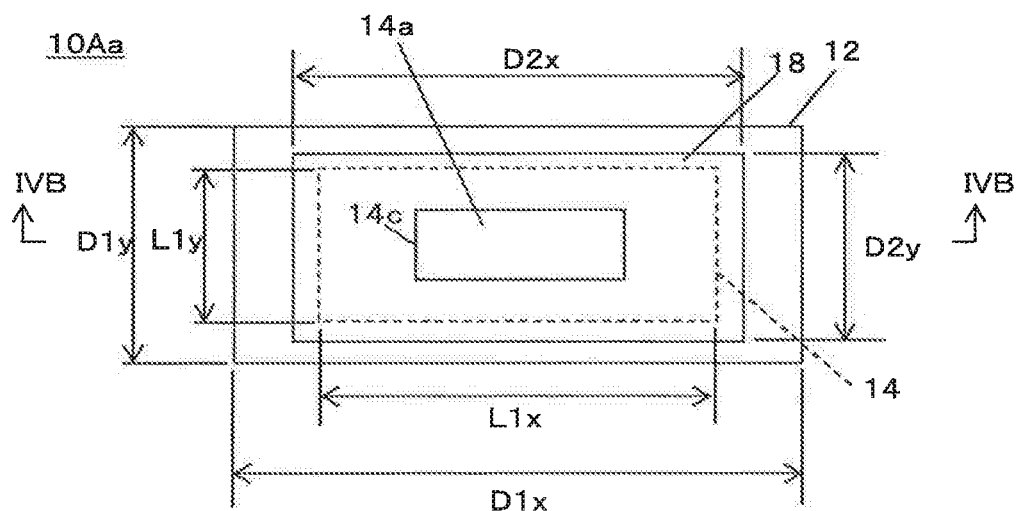
FIG. 4A is a plan view showing a first modification as viewed from an upper surface of the first ceramic circuit board.
Figure 4B:
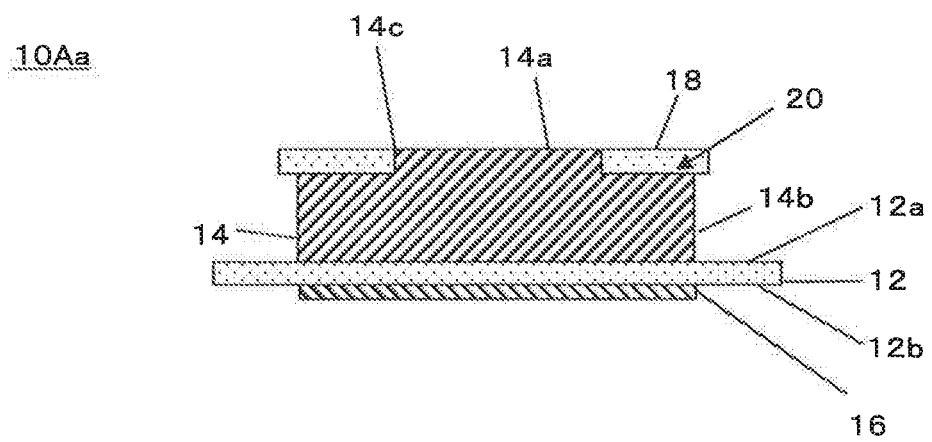
FIG. 4B is a cross-sectional view taken along line IVB-IVB in FIG. 4A.
Figure 5A:
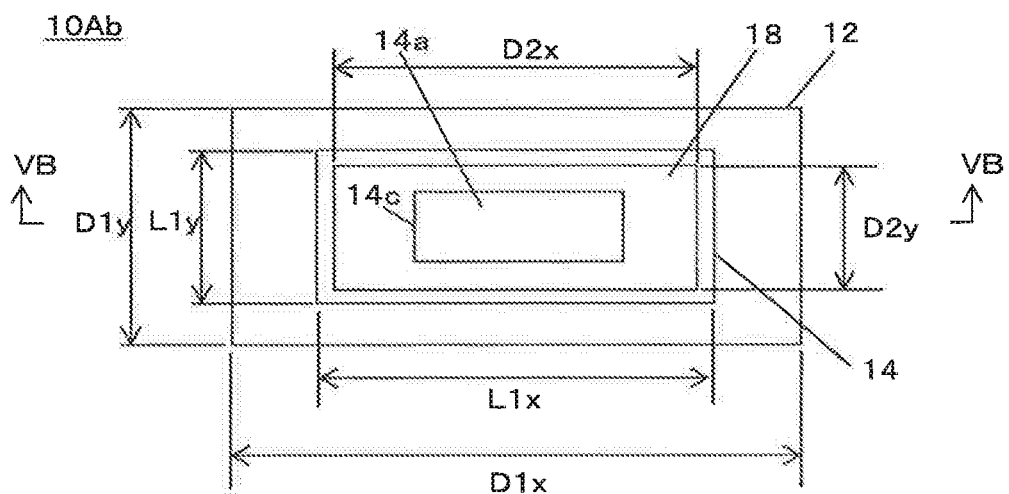
FIG. 5A is a plan view showing a second modification as viewed from an upper surface of the first ceramic circuit board.
Figure 5B:
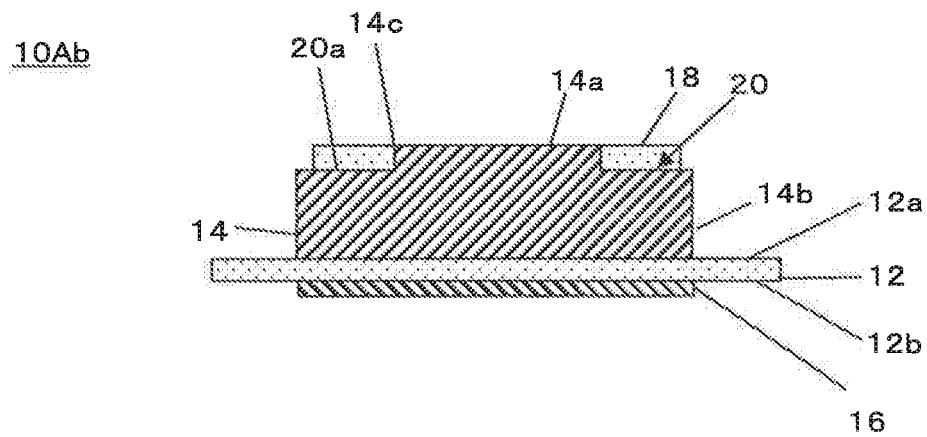
FIG. 5B is a cross-sectional view taken along line VB-VB in FIG. 5A.

In addition, as shown in FIG. 3A, the power semiconductor 26 is mounted through a bonding layer 24 of solder or the like to the front surface 14a of the first metal plate 14, whereby an electronic device (hereinafter referred to as a "first electronic device 28A") is made up according to the first embodiment of the invention. As shown in FIG. 3B, it is a matter of course that the first electronic device 28A may also be constituted by further bonding a heat sink 30 to an end surface of the second metal plate 16. Moreover, as shown in FIGS. 3A and 3B, etc., although the height of the power semiconductor 26 is illustrated as being thinner than the thickness of the member 18, the invention is not limited to this feature.

In the first ceramic circuit board 10A, since the member 18 is bonded in the recess 20, which is formed on the front surface 14a of the first metal plate 14, due to the heat cycle during operation thereof, the following thermal stresses are generated.

(a) A thermal stress accompanying a difference in thermal expansion between the first metal plate 14 and the ceramic substrate 12 is generated at an interface 32a (hereinafter referred to as a "first interface 32a") between the first metal plate 14 and the ceramic substrate 12.

(b) A thermal stress accompanying a difference in thermal expansion between the second metal plate 16 and the ceramic substrate 12 is generated at an interface 32b (hereinafter referred to as a "second interface 32b") between the second metal plate 16 and the ceramic substrate 12.

(c) A thermal stress accompanying a difference in thermal expansion between the first metal plate 14 and the member 18 is generated at an interface 32c (hereinafter referred to as a "third interface 32c") between the first metal plate 14 and the member 18.

Although thermal stresses are generated and concentrated at the first interface 32a between the first metal plate 14 and the ceramic substrate 12 according to the conventional technique, with the present invention, in particular, due to generation of the thermal stress indicated by (c) above, the thermal stress indicated by (a) is alleviated (reduced). More specifically, thermal stresses due to the heat cycle are generated in a distributed manner between the first interface 32a and the third interface 32c. As a result, within the front surface 12a of the ceramic substrate 12, compressive stresses and tensile stresses, which are applied concentratively at the boundary portion between the first interface 32a and portions in the vicinity thereof, are alleviated, such that cracks or splitting of the ceramic substrate 12 due to the heat cycle during usage thereof do not occur. Consequently, the thickness t1 of the first metal plate 14 can be increased, and the heat dissipation properties of the ceramic circuit board can be enhanced.

Further, due to alleviation of thermal stresses at the first interface 32a, even if the thickness t2 of the second metal plate 16 is less than the thickness t1 of the first metal plate 14, the occurrence of warping of the first ceramic circuit board 10A overall is suppressed, the occurrence of cracks or breaking off of the solder-attached power semiconductor 26, and the occurrence of cracks in the bonding layer 24 can be avoided. Consequently, the distance from the ceramic substrate 12 to the heat sink 30 can be shortened, an improvement in heat dissipation can be achieved, and an advantage is brought about in that the first ceramic circuit board 10A can be made thin or low in profile. Further, the surface (the front surface 14a of the first metal plate 14) on which the power semiconductor 26 is mounted is approximately at the same height as the surface of the member 18, or is greater in height than the surface of the member 18. Therefore, mounting of the power semiconductor 26 can be facilitated and improved.

Further, as the member 18 and the ceramic substrate 12, elements preferably are used in which at least material properties and thicknesses thereof are adjusted so as to suppress warping of the first ceramic circuit board 10A. Such a feature can be accomplished by adjusting the coefficients of thermal expansion, the Young's moduli, and thereby the respective thicknesses of the member 18 and the ceramic substrate 12. For example, in the case that the Young's moduli of the member 18 and the ceramic substrate 12 are equal to each other, if the coefficient of thermal expansion of the member 18 is less than that of the ceramic substrate 12, then the thickness of the member 18 is made thinner than the ceramic substrate 12. Further, the constituent materials of the member 18 and the ceramic substrate 12 may be of the same type; for example, the constituent material of the member 18 may be a ceramic. More specifically, in the case that the constituent material of the ceramic substrate 12 is $Si_3N_4$, the member 18 may also be constituted from $Si_3N_4$ or the like. $Si_3N_4$ exhibits high strength and toughness/tenacity as well as high thermal conductivity, and is highly resistant to cracks or splitting of the ceramic substrate 12 due to the heat cycle. Therefore, $Si_3N_4$ is preferably used.

A ceramic material, a semiconductor material, a metallic material, and the like are preferably used as a constituent material of the member 18. The ceramic material includes by way of example, $Si_3N_4$, AlN, $Al_2O_3$, SiC (silicon carbide), cordierite, mullite and the like. The semiconductor material includes by way of example, Si (silicon), GaN (gallium nitride), SiC and the like. The metallic material includes by way of example, W (tungsten), Mo (molybdenum), Cr (chromium), Nb (niobium), Ir (iridium), and an alloy containing these materials as the main component (CuMo, CuW, and the like).

The member 18 preferably has the thickness of 100 µm or more, and 1 mm or less, and exhibits the coefficient of thermal expansion of 10 ppm/K or less. The Young's modulus of the member 18 is preferably higher than that of the first metal plate 14. For example, in the case that the first metal plate 14 is made of copper, the Young's modulus of the member 18 is preferably 130 GPa or more. The occurrence of cracks in the bonding layer 24 or the ceramic substrate 12 due to the heat cycle (described later) can be avoided effectively. Further, in the case that the member 18 is made of a similar material to that of the ceramic substrate 12, it is advantageous in cost since the member 18 can be manufactured at the same time of the manufacture of the ceramic substrate 12.

Concerning the bond between the member 18 and the first metal plate 14, brazing through an Ag—Cu type brazing material and the like may be used in the case that the constituent material of the member 18 is a ceramic or semiconductor material. Alternatively, in the case that the constituent material of the member 18 is a metallic material, coating such as thermal spraying may be used, as well as brazing.

In this manner, in the first electronic device 28A and the first ceramic circuit board 10A, thermal stresses that occur at the first interface 32a between the first metal plate 14 and the ceramic substrate 12 can be alleviated, even in the case that the first metal plate 14, which is provided at least on a side on which the power semiconductor 26 is mounted, is increased in thickness, and together therewith, the occurrence of warping can be suppressed, and heat dissipation can be enhanced. In addition, an advantage is brought about in that the first electronic device 28A and the first ceramic circuit board 10A can be made smaller in scale.

Next, several modifications of the first ceramic circuit board 10A will be described with reference to FIGS. 4A through 10C.

Among the aforementioned dimensional relationships, the examples of (A-2), (A-4), (A-5), (A-6), and (A-8) are illustrative of examples in which portions of the member 18 extend out in the lateral (transverse) direction beyond the outer circumference 14c of the front surface 14a of the first metal plate 14. The example of (A-5) (i.e., a first ceramic circuit board 10Aa according to a first modification) is shown representatively in FIGS. 4A and 48. With the first modification, positional alignment when the member 18 is bonded to the front surface 14a of the first metal plate 14 is simplified, so that a reduction in man-hours, an improvement in yield, and an improvement in productivity can be achieved.

The examples of (A-3), (A-7), and (A-9) are illustrative of examples in which the entirety of the member 18 is bonded within the bottom surface 20a of the recess 20. The example of (A-9) (i.e., a first ceramic circuit board 10Ab according to a second modification) is shown representatively in FIGS. 5A and 58. With the second modification, the constituent material amount of the member 18 can be kept to a minimum, and manufacturing costs can be reduced.

Figure 6A:
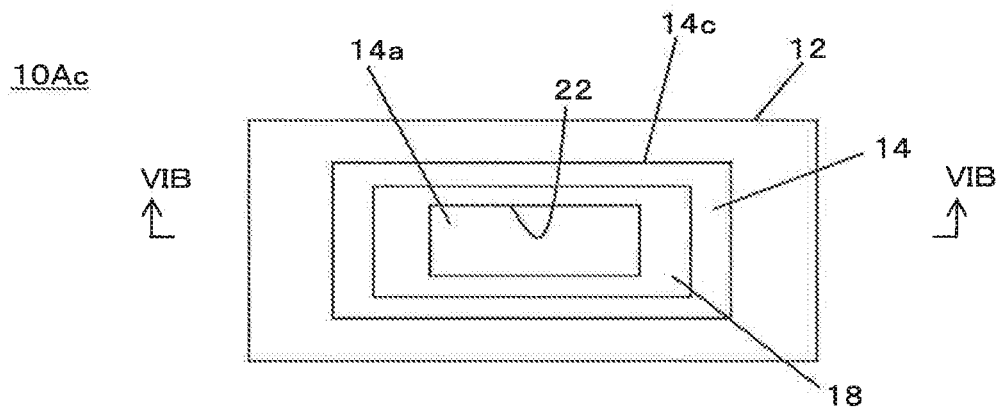
FIG. 6A is a plan view showing a third modification as viewed from an upper surface of the first ceramic circuit board.
Figure 6B:
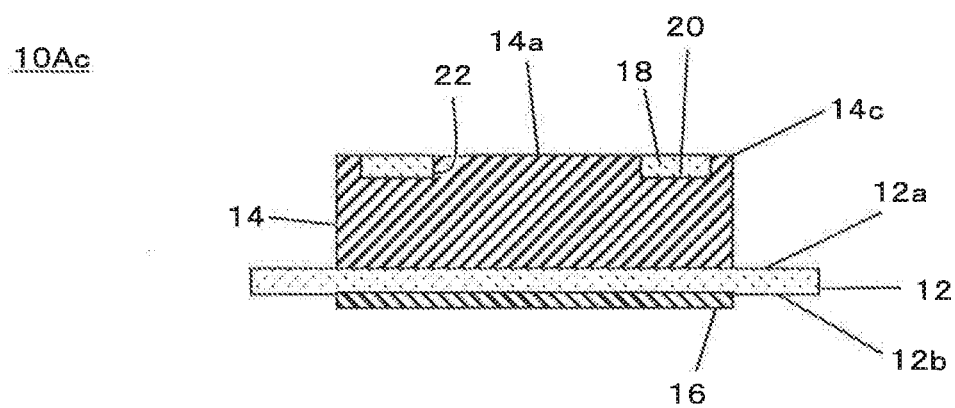
FIG. 6B is a cross-sectional view taken along line VIB-VIB in FIG. 6A.

A first ceramic circuit board 10Ac according to a third modification is substantially the same in structure as the first ceramic circuit board 10A, but differs therefrom in that, as shown in FIGS. 6A and 68, an annular recess 20 is formed at a position inside of the outer circumference 14c of the front surface 14a of the first metal plate 14.

First ceramic circuit boards 10Ad and 10Ae according to fourth and fifth modifications are substantially the same in structure as the first ceramic circuit board 10A, but differ therefrom in that, as shown in FIGS. 7A through 8B, plural members 18 are arranged along the annular shape of the recess 20. With the fourth modification and the fifth modification, production of the members 18 is simplified, a reduction in man-hours, an improvement in yield, and an improvement in productivity can be achieved.

Figure 7A:
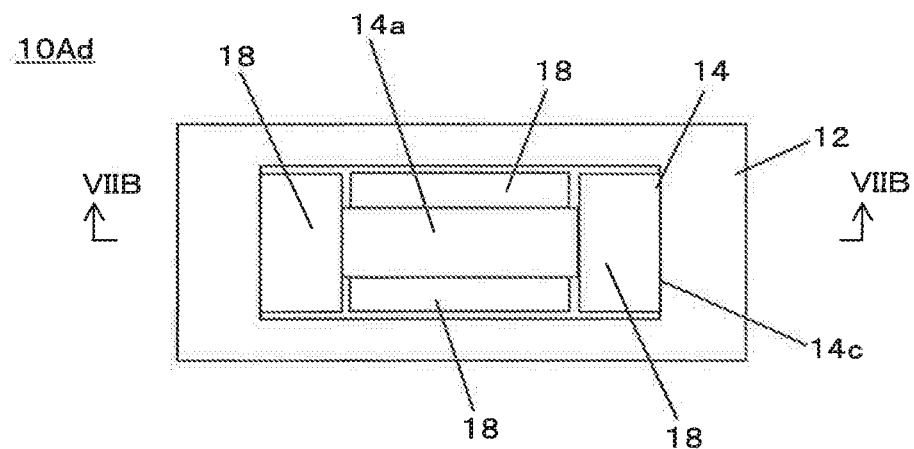
FIG. 7A is a plan view showing a fourth modification as viewed from an upper surface of the first ceramic circuit board.
Figure 7B:
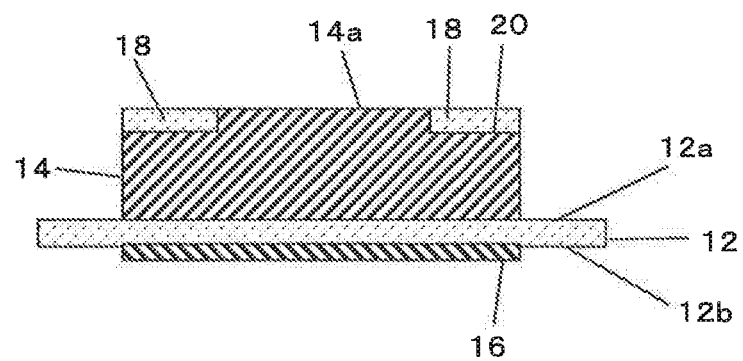
FIG. 7B is a cross-sectional view taken along line VIIB-VIIB in FIG. 7A.
Figure 8A:
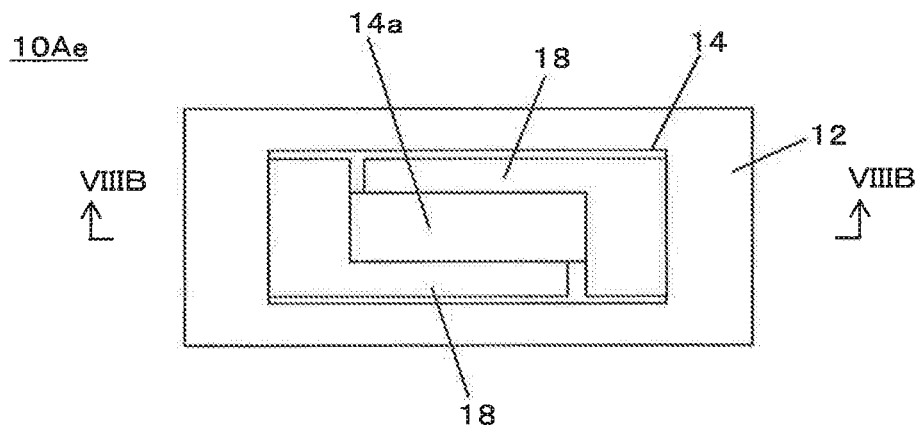
FIG. 8A is a plan view showing a fifth modification as viewed from an upper surface of the first ceramic circuit board.
Figure 8B:
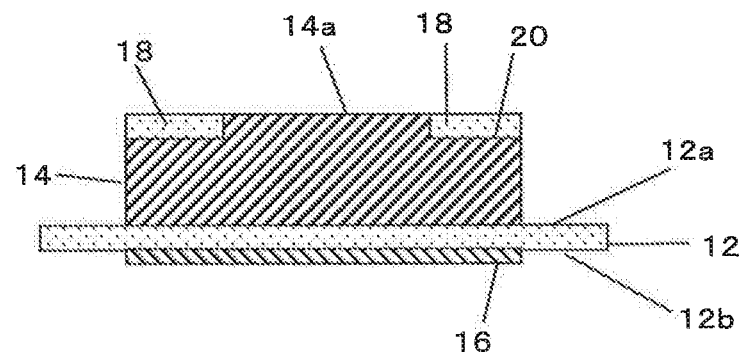
FIG. 8B is a cross-sectional view taken along line VIIIB-VIIIB in FIG. 8A.

With the fourth modification, as shown in FIGS. 7A and 7B, four flat plate-shaped members 18 that extend linearly are arranged along the annular shape of the recess 20. With the fifth modification, as shown in FIGS. 8A and 8B, two flat plate-shaped members 18, which are bent in the shape of the letter L, are arranged along the annular shape of the recess 20.

Figure 9A:
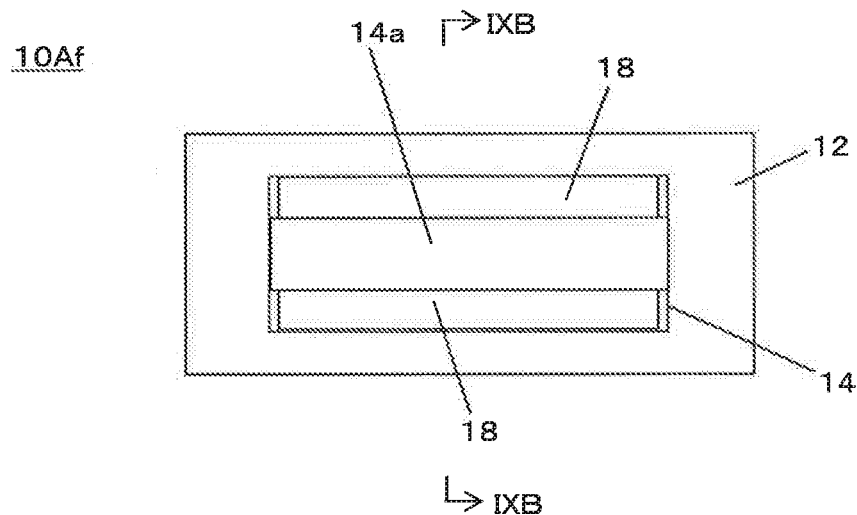
FIG. 9A is a plan view showing a sixth modification as viewed from an upper surface of the first ceramic circuit board.
Figure 9B:
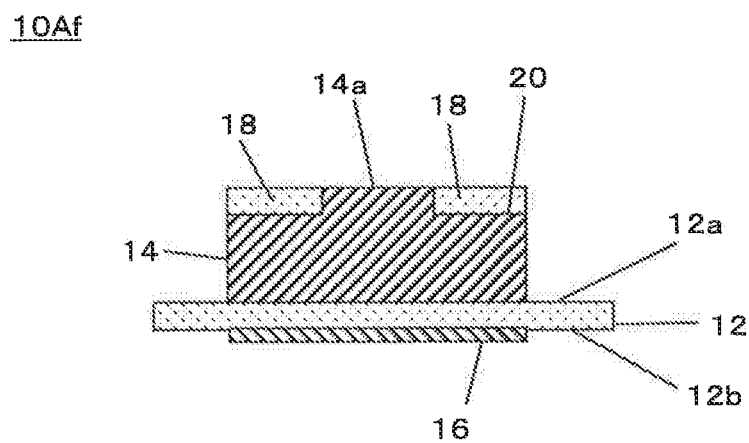
FIG. 9B is a cross-sectional view taken along line IXB-IXB in FIG. 9A.

A first ceramic circuit board 10Af according to a sixth modification is substantially the same in structure as the first ceramic circuit board 10A, but differs therefrom in that, as shown in FIGS. 9A and 9B, two recesses 20 that extend in straight lines are formed at linearly symmetric positions, respectively, with members 18 being bonded, respectively, in each of the recesses 20. In this case, the constituent material amount of the members 18 can be kept to a minimum, and manufacturing costs can be reduced.

Figure 10A:
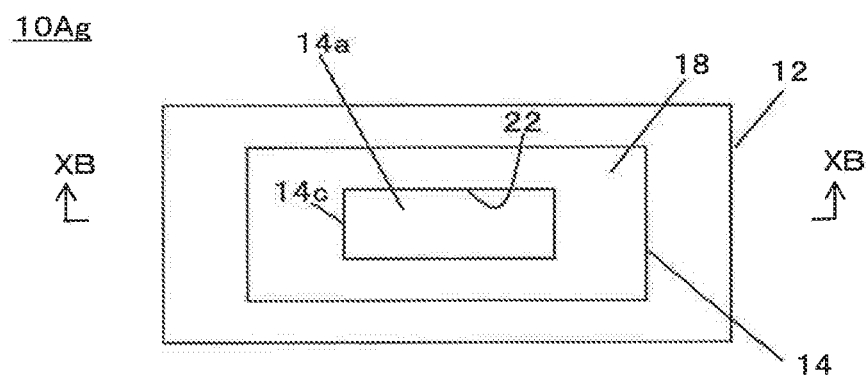
FIG. 10A is a plan view showing a seventh modification as viewed from an upper surface of the first ceramic circuit board.
Figure 10B:
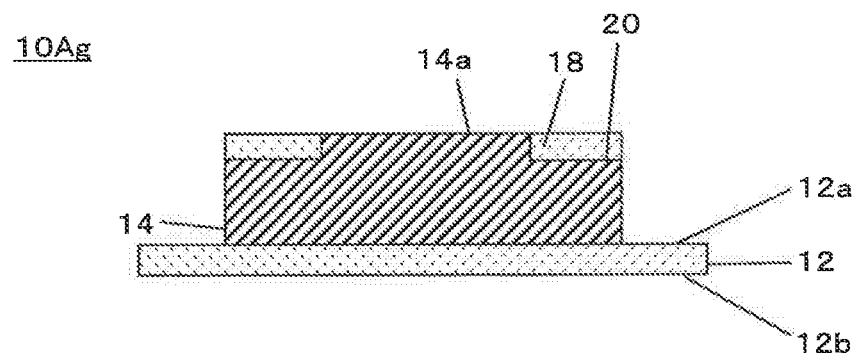
FIG. 10B is a cross-sectional view taken along line XB-XB in FIG. 10A.
Figure 10C:
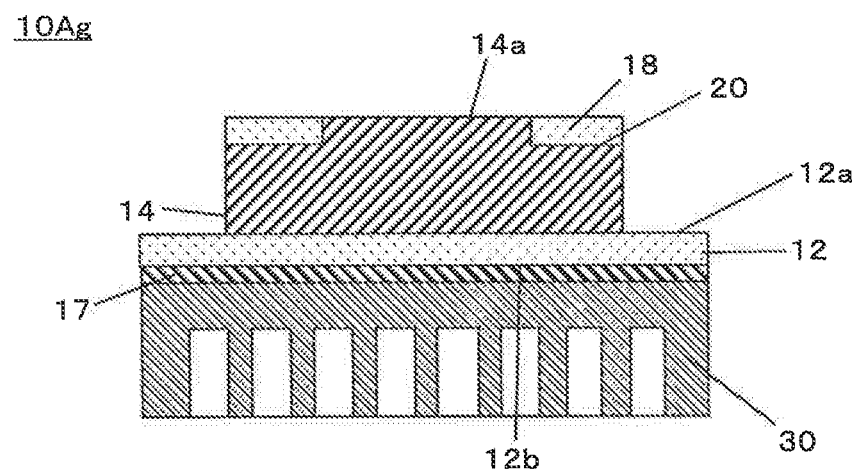
FIG. 10C is a vertical cross-sectional view showing an example in which a ceramic substrate and a heat sink are bonded with a thermal conductive grease or a TIM (thermal interface material) or the like interposed therebetween.

A first ceramic circuit board 10Ag according to a seventh modification is substantially the same in structure as the first ceramic circuit board 10A, but differs therefrom in that, as shown in FIGS. 10A and 10B, the second metal plate 16 is not bonded to the rear surface 12b of the ceramic substrate 12. For the first ceramic circuit board 10Ag, in the case that the heat sink 30 is bonded to the rear surface 12b of the ceramic substrate 12, a thermal conductive grease or TIM 17 or the like may be interposed between the rear surface 12b of the ceramic substrate 12 and the heat sink 30, as shown in FIG. 10C.

In the first ceramic circuit boards 10Aa to 10Ag according to the first through seventh modifications described above, the same effects and advantages as the first ceramic circuit board 10A are attained.

Next, a ceramic circuit board (hereinafter referred to as a "second ceramic circuit board 10B") according to a second embodiment of the present invention, and an electronic device (hereinafter referred to as a "second electronic device 28B") according to the second embodiment will be described below with reference to FIGS. 11A through 18C.

Figure 11A:
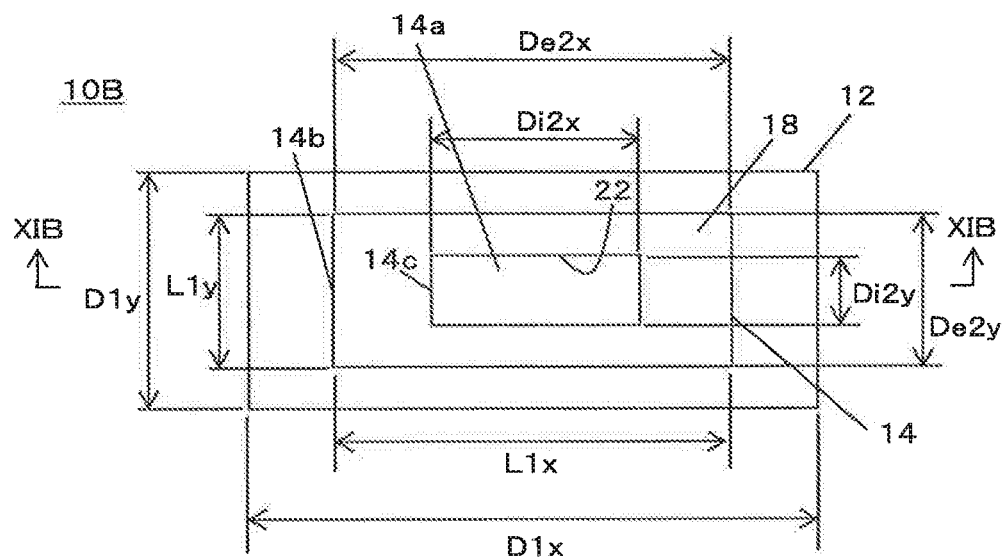
FIG. 11A is a plan view showing a ceramic circuit board (second ceramic circuit board) as viewed from an upper surface thereof according to a second embodiment of the present invention.
Figure 11B:
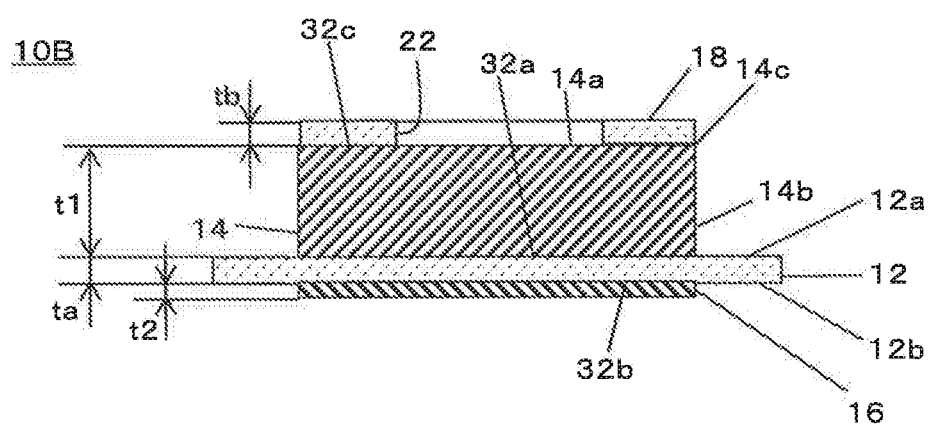
FIG. 11B is a cross-sectional view taken along line XIB-XIB in FIG. 11A.
Figure 12A:
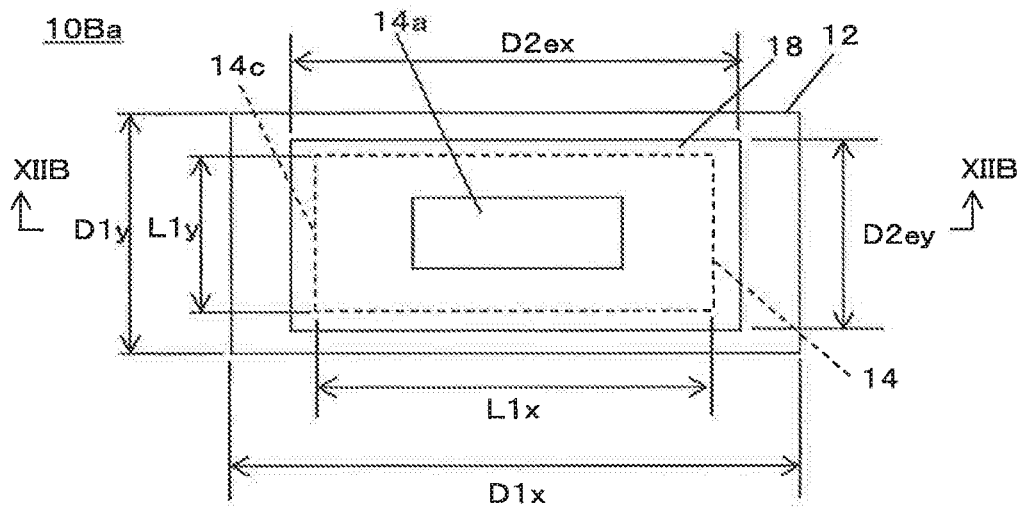
FIG. 12A is a plan view showing a first modification as viewed from an upper surface of the second ceramic circuit board.
Figure 12B:
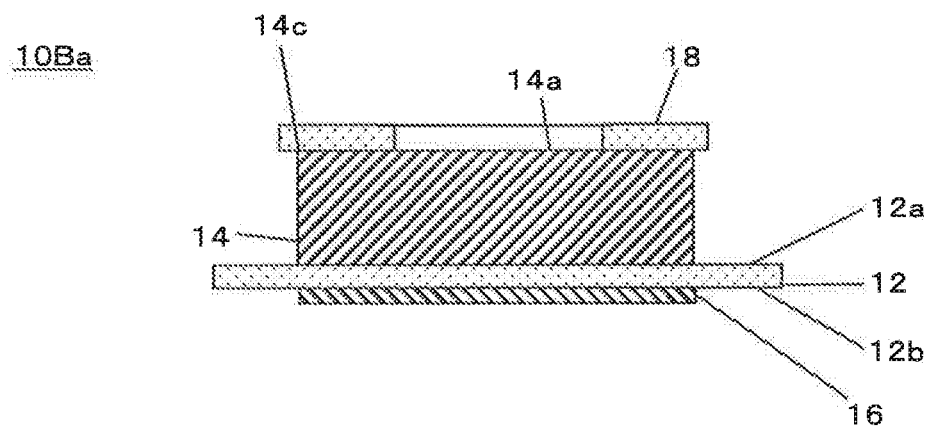
FIG. 12B is a cross-sectional view taken along line XIIB-XIIB in FIG. 12A.
Figure 13A:
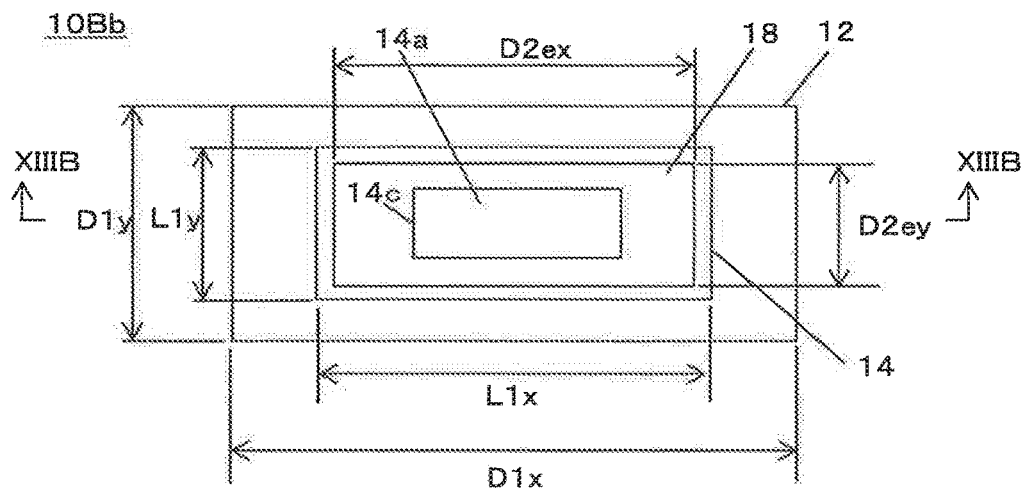
FIG. 13A is a plan view showing a second modification as viewed from an upper surface of the second ceramic circuit board.
Figure 13B:
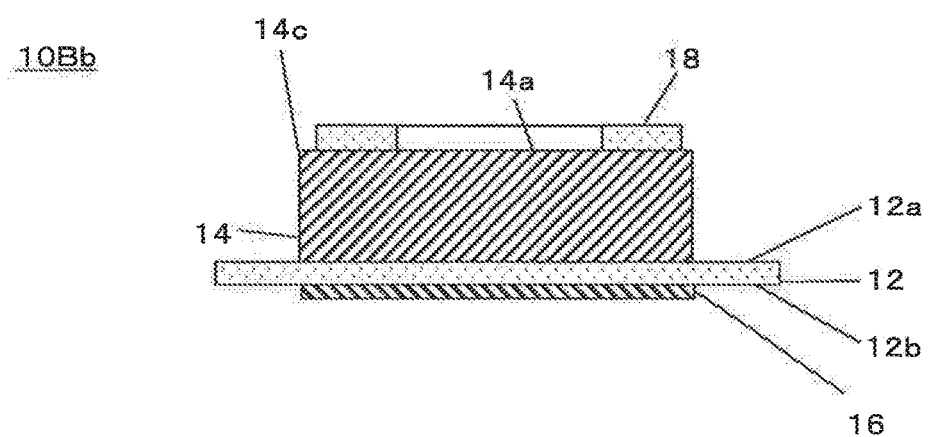
FIG. 13B is a cross-sectional view taken along line XIIIB-XIIIB in FIG. 13A.

The second ceramic circuit board 10B is substantially the same in structure as the above-described first ceramic circuit board 10A, but differs therefrom in that, as shown in FIGS. 11A and 11B, a recess is not provided in the front surface 14a of the first metal plate 14, but rather, a ring-shaped member 18 is bonded to a flat front surface 14a (flat surface) thereof.

The following relationships are defined between inner circumferential lengths of the member 18 as viewed from the upper surface thereof (i.e., a length $Di2y$ in the vertical direction and the length $Di2x$ in the horizontal (transverse) direction), and the length $L1y$ in the vertical direction and the length $L1x$ in the horizontal direction of the first metal plate 14.

$$Di2y < L1y$$

$$Di2x < L1.$$

Any of the following relationships may be adopted as a relationship between outer circumferential lengths of the member 18 as viewed from the upper surface thereof (i.e., a length $De2y$ in the vertical direction and a length $De2x$ in the horizontal direction), and the length $L1y$ in the vertical direction and the length $L1x$ in the horizontal direction of the first metal plate 14.

$$D2ey = L1y, D2ex = L1x \tag{B-1}$$

$$D2ey > L1y, D2ex = L1x \tag{B-2}$$

$$D2ey < L1y, D2ex = L1x \tag{B-3}$$

$$D2ey = L1y, D2ex > L1x \tag{B-4}$$

$$D2ey > L1y, D2ex > L1x \tag{B-5}$$

$$D2ey < L1y, D2ex > L1x \tag{B-6}$$

$$D2ey = L1y, D2ex < L1x \tag{B-7}$$

$$D2ey > L1y, D2ex < L1x \tag{B-8}$$

$$D2ey < L1y, D2ex < L1x \tag{B-9}$$

Among these relationships, the example of (B-1) is shown for the above-described second ceramic circuit board 10B (see FIGS. 11A and 11B).

Among the aforementioned dimensional relationships, the examples of (B-2), (B-4), (B-5), (B-6), and (B-8) are illustrative of examples in which portions of the member 18 extend out in the lateral (transverse) direction beyond the outer circumference 14c of the front surface 14a of the first metal plate 14. The example of (B-5) (i.e., a second ceramic circuit board 10Ba according to a first modification) is shown representatively in FIGS. 12A and 12B. With the first modification, positional alignment when the member 18 is bonded to the front surface 14a of the first metal plate 14 is simplified, so that a reduction in man-hours, an improvement in yield, and an improvement in productivity can be achieved.

The examples of (B-3), (B-7), and (B-9) are illustrative of examples in which the entirety of the member 18 is bonded within the front surface 14a of the first metal plate 14. The example of (B-9) (i.e., a second ceramic circuit board 10Bb according to a second modification) is shown representatively in FIGS. 13A and 13B. With the second modification, the constituent material amount of the member 18 can be kept to a minimum, and manufacturing costs can be reduced.

Second ceramic circuit boards 10Bc and 10Bd according to third and fourth modifications are substantially the same in structure as the first ceramic circuit board 10A, but differ therefrom in that, as shown in FIGS. 14A through 15B, plural members 18 are arranged along the outer circumference 14c of the front surface 14a of the first metal plate 14. With the third modification and the fourth modification, production of the members 18 is simplified, so that a reduction in man-hours, an improvement in yield, and an improvement in productivity can be achieved.

Figure 14A:
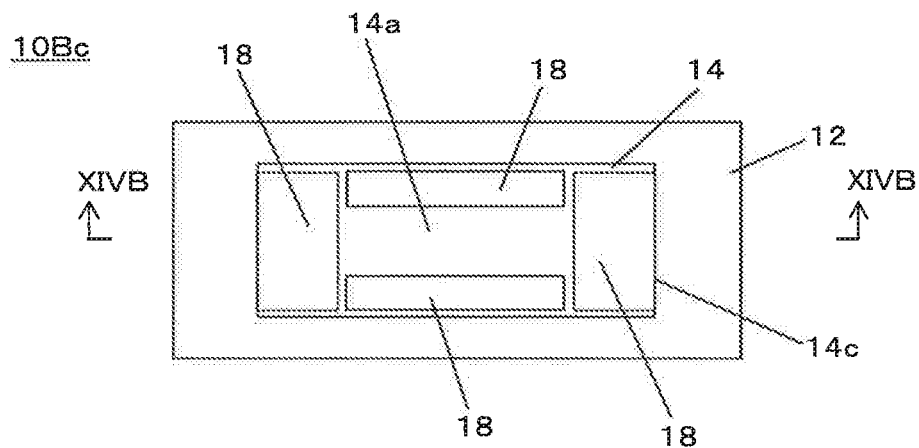
FIG. 14A is a plan view showing a third modification as viewed from an upper surface of the second ceramic circuit board.
Figure 14B:
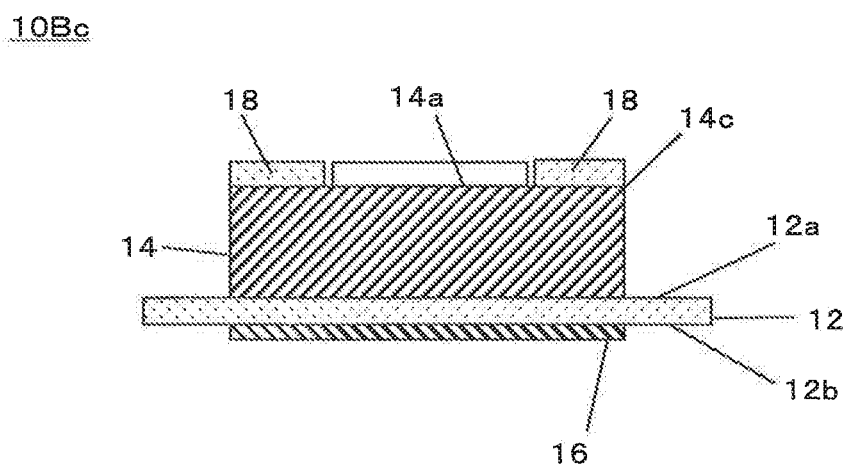
FIG. 14B is a cross-sectional view taken along line XIVB-XIVB in FIG. 14A.
Figure 15A:
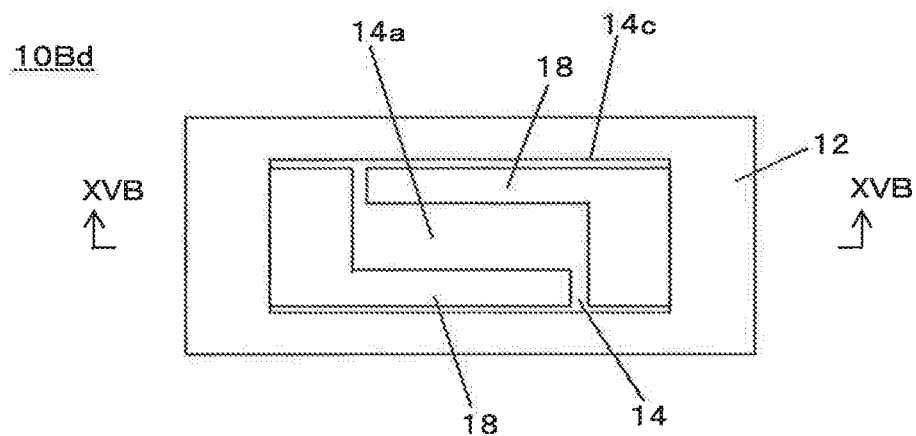
FIG. 15A is a plan view showing a fourth modification as viewed from an upper surface of the second ceramic circuit board.
Figure 15B:
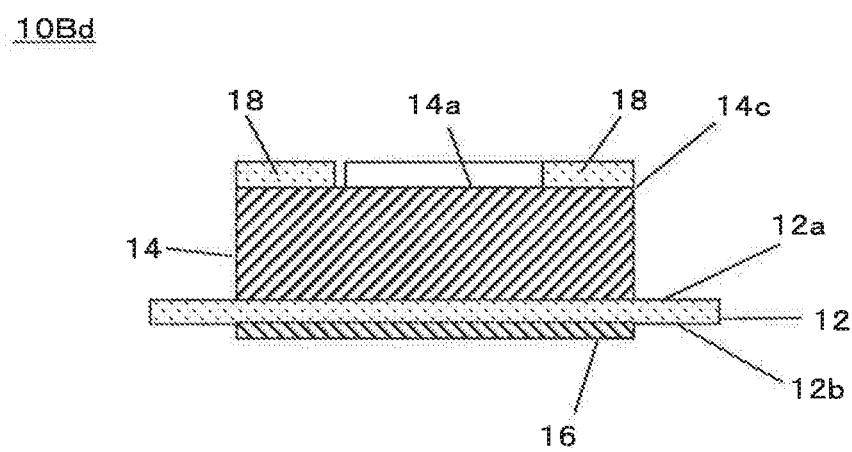
FIG. 15B is a cross-sectional view taken along line XVB-XVB in FIG. 15A.

With the third modification, as shown in FIGS. 14A and 14B, four flat plate-shaped members 18 that extend linearly are arranged along the outer circumference 14c of the front surface 14a of the first metal plate 14. With the fourth modification, as shown in FIGS. 15A and 15B, two flat plate-shaped members 18, which are bent in the shape of the letter L, are arranged along the outer circumference 14c of the front surface 14a of the first metal plate 14.

Figure 16A:
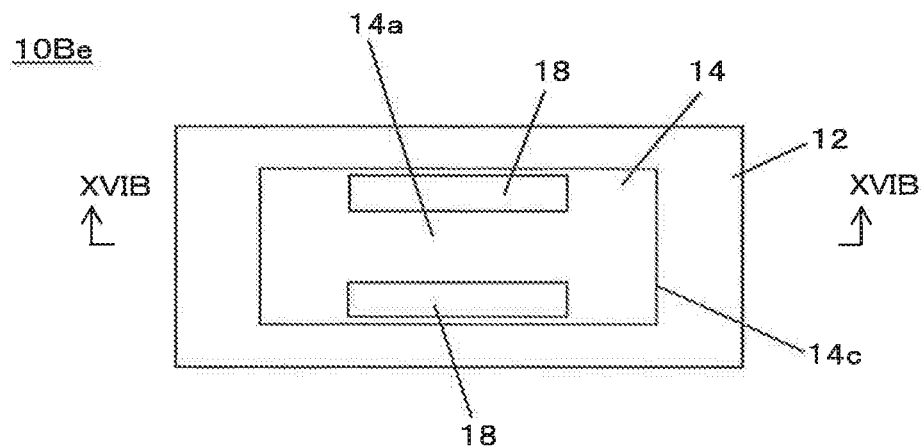
FIG. 16A is a plan view showing a fifth modification as viewed from an upper surface of the second ceramic circuit board.
Figure 16B:
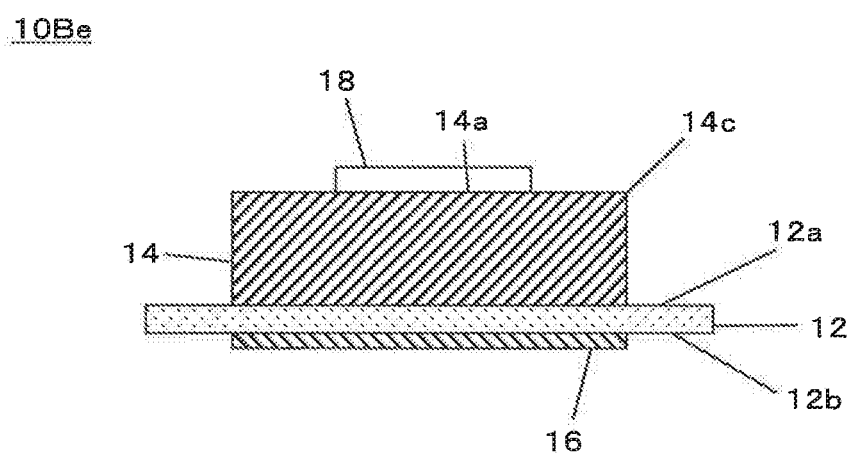
FIG. 16B is a cross-sectional view taken along line XVIB-XVIB in FIG. 16A.

As shown in FIGS. 16A and 16B, a second ceramic circuit board 10Be according to a fifth modification includes a configuration in which certain ones of the members 18 are omitted from the aforementioned third modification. In FIGS. 16A and 16B, an example is illustrated in which two of the members 18 having longer sides extending in the same direction are bonded (i.e., two members 18 that extend in straight lines are bonded at linearly symmetric positions, respectively). With the fifth modification, the constituent material amount of the members 18 can be kept to a minimum, and manufacturing costs can be reduced.

Figure 17A:
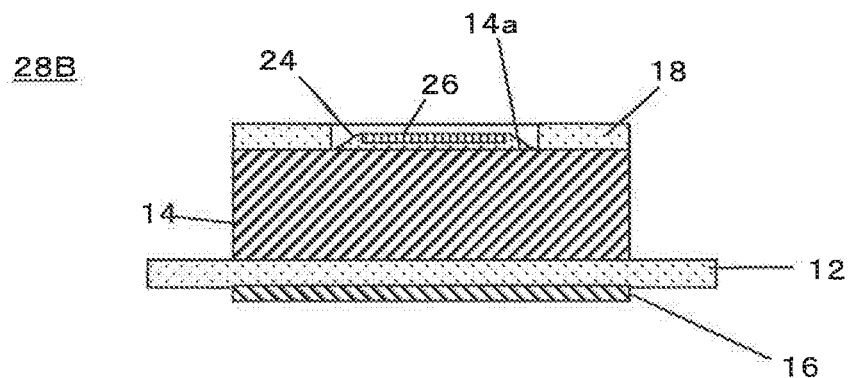
FIG. 17A is a vertical cross-sectional view showing an electronic device (second electronic device) according to the second embodiment.
Figure 17B:
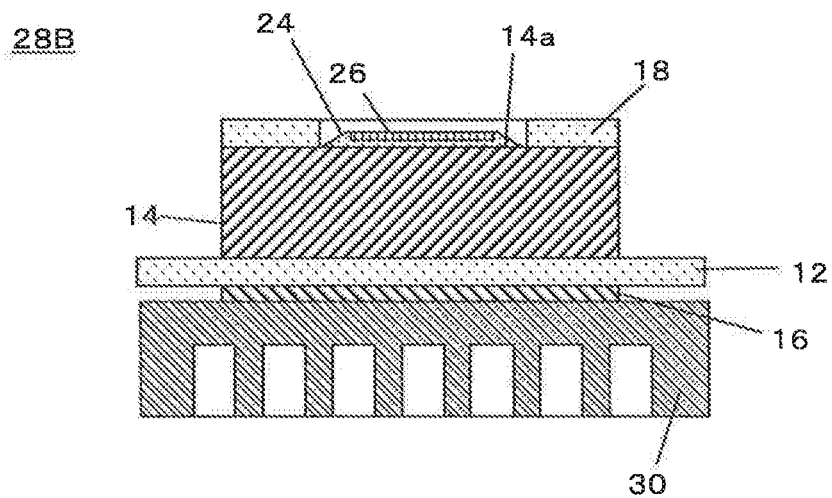
FIG. 17B is a vertical cross-sectional view showing another second electronic device.

In addition, as shown in FIG. 17A, in a second electronic device 28B, in a similar manner to the above-described first electronic device 28A, within the front surface 14a (flat surface) of the first metal plate 14, a power semiconductor 26 is mounted through a bonding layer 24 of solder or the like to a portion of the first metal plate 14, which is exposed from a hole 22 of the member 18. As shown in FIG. 17B, it is a matter of course that the second electronic device 28B may also be constituted by further bonding a heat sink 30 to an end surface of the second metal plate 16.

In the second ceramic circuit board 10B, since the member 18 is bonded to the front surface 14a (flat surface) of the first metal plate 14, due to the heat cycle during operation thereof, the thermal stresses indicated by items (a) through (c) above are generated.

Accordingly, generation of thermal stresses, which are concentrated at the first interface 32a, is avoided, such that cracks or splitting of the ceramic substrate 12 due to the heat cycle during usage thereof do not occur. As a result, the thickness t1 of the first metal plate 14 can be increased, and the heat dissipation properties of the ceramic circuit board can be enhanced.

Further, the thickness t2 of the second metal plate 16 can be made smaller than the thickness t1 of the first metal plate 14, an improvement in heat dissipation can be achieved, and an advantage is brought about in that the second ceramic circuit board 10B can be made thin or low in profile.

Figure 18A:
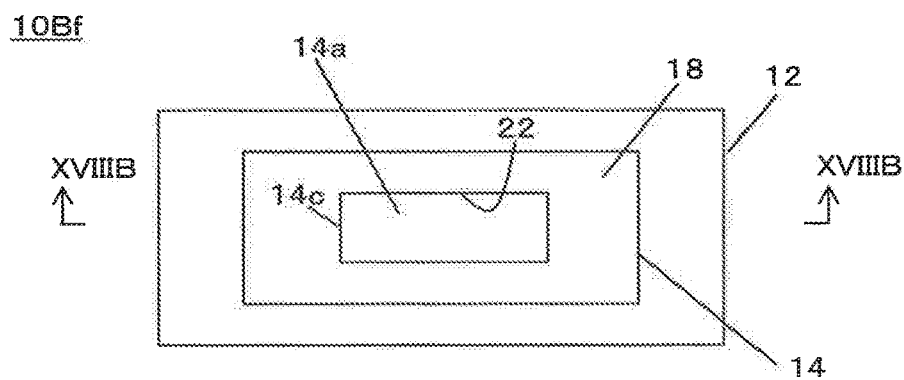
FIG. 18A is a plan view showing a sixth modification as viewed from an upper surface of the second ceramic circuit board.
Figure 18B:
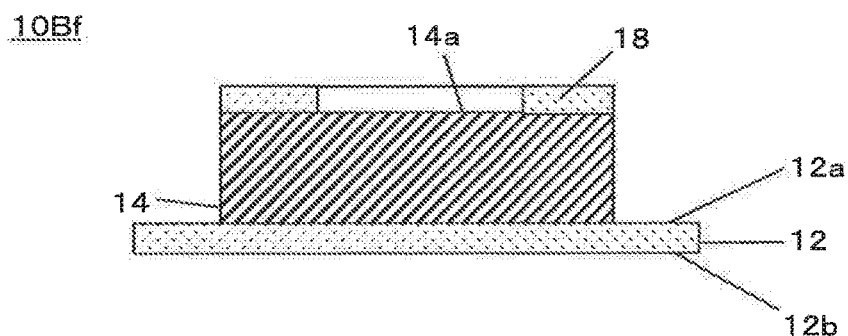
FIG. 18B is a cross-sectional view taken along line XVIIIB-XVIIIB in FIG. 18A.
Figure 18C:
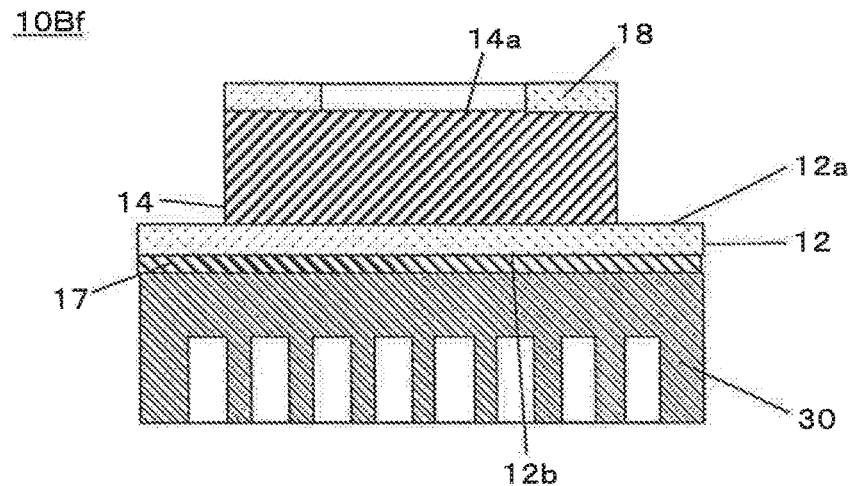
FIG. 18C is a vertical cross-sectional view showing an example in which a ceramic substrate and a heat sink are bonded with a thermal conductive grease or a TIM or the like interposed therebetween.
Figure 19A:
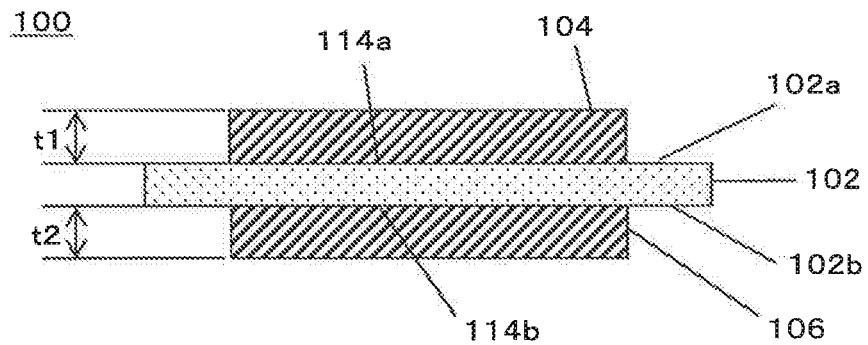
FIG. 19A is a vertical cross-sectional view showing a ceramic circuit board according to a conventional technique.
Figure 19B:
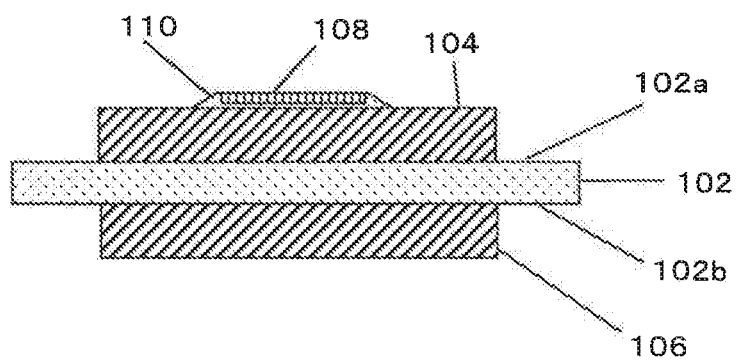
FIG. 19B is a vertical cross-sectional view showing a condition in which a power semiconductor is mounted through a solder layer on a first metal plate.

Moreover, as shown in FIGS. 18A and 18B, a structure may be adopted (a second ceramic circuit board 10Bf according to a sixth modification) in which the second metal plate 16 is not bonded to the rear surface 12b of the ceramic substrate 12. For the second ceramic circuit board 10Bf, in the case that the heat sink 30 is bonded to the rear surface 12b of the ceramic substrate 12, the thermal conductive grease or TIM 17 or the like may be interposed between the rear surface 12b of the ceramic substrate 12 and the heat sink 30, as shown in FIG. 18C.

In the second ceramic circuit boards 10Ba to 10Bf according to the first through sixth modifications described above, the same effects and advantages as those of the second ceramic circuit board 10B are attained.

EXAMPLES

First Example

An evaluation as to the presence or absence of cracks in the bonding layer 24 and the ceramic substrate 12 was performed with respect to Inventive Examples 1 through 5 and Comparative Examples 1 and 2. The results of this evaluation are shown in Table 1, which will be discussed below.

For the ceramic substrate 12 and the members 18, a silicon nitride ($Si_3N_4$) board was prepared having a thickness of 0.3 mm with a bending (flexural) strength of 650 MPa. For the first metal plate 14 and the second metal plate 16, an oxygen-free copper (Cu) plate was prepared. Further, an Ag—Cu type brazing material paste, to which there was added a Ti active metal powder, was prepared.

Example 1

A ceramic circuit board for evaluation according to Example 1 included a structure similar to that of the second ceramic circuit board 10B shown in FIGS. 11A and 11B. More specifically, an annular (ring-shaped) member 18 was used (denoted by the term "(annular)" in Table 1).

At first, a brazing material was coated at a thickness of 10 μm on the ceramic substrate 12 and the member 18, and Cu plates (the first metal plate 14 and the second metal plate 16) were bonded with the ceramic substrate 12 and the member 18. The thickness t1 of the first metal plate 14 was 2 mm, and the thickness t2 of the second metal plate 16 was 0.1 mm. The bonding conditions were such that heated pressure bonding was carried out under a vacuum at a temperature of 800° C. and a pressure of 1 MPa. Thereafter, as shown in FIGS. 17A and 17B, a power semiconductor 26 was bonded through a bonding layer 24 (in this case, a solder layer) to thereby obtain an evaluation sample according to Example 1. Ten of such evaluation samples were prepared.

Example 2

A ceramic circuit board for evaluation according to Example 2 included a structure similar to that of the second ceramic circuit board 10Bc shown in FIGS. 14A and 14B. More specifically, four members 18 were arranged and bonded along the outer circumference 14c of the front surface 14a of the first metal plate 14 (denoted by the term "(division 1)" in Table 1). Otherwise, features thereof were the same as those of Example 1, and ten of such evaluation samples according to Example 2 were prepared.

Example 3

A ceramic circuit board for evaluation according to Example 3 included a structure similar to that of the ceramic circuit board 10Be shown in FIGS. 16A and 16B. More specifically, two members 18 extending in straight line shapes were arranged and bonded at linearly symmetrical positions, respectively (denoted by the term "(division 2)" in Table 1). Otherwise, features thereof were the same as those of Example 1, and ten of such evaluation samples according to Example 3 were prepared.

Example 4

A ceramic circuit board for evaluation according to Example 4 included a structure similar to that of the first ceramic circuit board 10A shown in FIGS. 1A and 1B. More specifically, an outer circumferential portion of the front surface 14a of the first metal plate 14 was subjected to etching to thereby form an annular recess 20, and a ring-shaped member 18 was embedded and bonded in the recess 20 (denoted by the term "(embedded)" in Table 1). Otherwise, features thereof were the same as those of Example 1, and ten of such evaluation samples according to Example 4 were prepared.

Example 5

A ceramic circuit board for evaluation according to Example 5 included a structure similar to that of the ceramic circuit board 10Bf shown in FIGS. 18A and 18B. More specifically, the second metal plate 16 was not bonded to the rear surface 12b of the ceramic substrate 12. Otherwise, features thereof were the same as those of Example 1, and ten of such evaluation samples according to Example 5 were prepared.

Comparative Example 1

Figure 20:
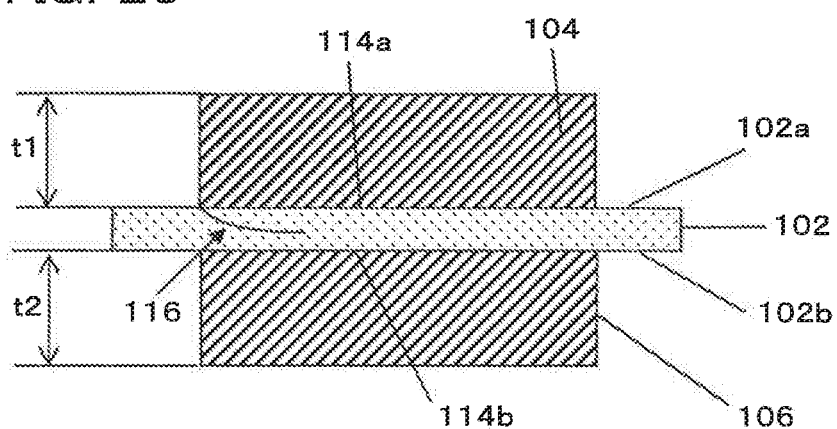
FIG. 20 is a schematic drawing showing a problem that occurs in the case that the thicknesses of the first metal plate and the second metal plate are increased in the ceramic circuit board according to the conventional technique.

A ceramic circuit board for evaluation according to Comparative Example 1 included a structure similar to that of the ceramic circuit board 100 shown in FIG. 20. More specifically, the member 18 was not bonded to the first metal plate 104, and the thicknesses of both the first metal plate 104 and the second metal plate 106 were 2 mm. Otherwise, features thereof were the same as those of Example 1, and ten of such evaluation samples according to Comparative Example 1 were prepared.

Comparative Example 2

A ceramic circuit board for evaluation according to Comparative Example 2 was the same as Example 1, except that the member 18 was not bonded to the first metal plate 104, the thickness of the first metal plate 104 was 2 mm, and the thickness of the second metal plate 106 was 0.1 mm. Ten of such evaluation samples according to Comparative Example 2 were prepared.

<Evaluation>

First, as an evaluation method, a heat cycle test was carried out over a temperature range of −40° C. to 125° C. The number of cycles was 100 cycles. Per each cycle, the temperature was held at −40° C. (low temperature) for 30 minutes and at 125° C. (high temperature) for 30 minutes. Upon completion of the heat cycle test, the occurrence ratio of cracks in the bonding layer 24, and the occurrence ratio of cracks in the ceramic substrate were evaluated. More specifically, the occurrence ratio of cracks in the bonding layer 24 was represented by, from among ten evaluation samples, the number of evaluation samples for which cracks were generated in the bonding layer 24, whereas the occurrence ratio of cracks in the ceramic substrate was represented by, from among ten evaluation samples, the number of evaluation samples for which cracks were generated in the ceramic substrate 12 (i.e., the ceramic substrate 102). In Table 1, the ratios are expressed by [The Number of Evaluation Samples in which Cracks were Generated]/[The Evaluation Sample Parameter (=10)]. The evaluation results are shown in the following Table 1.

TABLE 1

|  | PRESENCE OR ABSENCE OF MEMBER | THICKNESS OF FIRST METAL PLATE | THICKNESS OF SECOND METAL PLATE | OCCURRENCE RATIO OF CRACKS IN BONDING LAYER | OCCURRENCE RATIO OF CRACKS IN CERAMIC SUBSTRATE |
|---|---|---|---|---|---|
| EXAMPLE 1 | Present (annular) | 2 mm | 0.1 mm | 0/10 | 0/10 |
| EXAMPLE 2 | Present (division 1) | 2 mm | 0.1 mm | 0/10 | 0/10 |
| EXAMPLE 3 | Present (division 2) | 2 mm | 0.1 mm | 0/10 | 0/10 |
| EXAMPLE 4 | Present (embedded) | 2 mm | 0.1 mm | 0/10 | 0/10 |
| EXAMPLE 5 | Present (annular) | 2 mm | absent | 0/10 | 0/10 |
| COMP. EXAMPLE 1 | Absent | 2 mm | 2 mm | 0/10 | 7/10 |
| COMP. EXAMPLE 2 | Absent | 2 mm | 0.1 mm | 10/10 | 0/10 |

(COMP. EXAMPLE means "COMPARATIVE EXAMPLE")

From Table 1, it can be understood that, in the evaluation samples according to Examples 1 to 5, cracks were not generated in any of the bonding layers 24 and the ceramic substrates 12. This can be considered to have occurred because thermal stresses, which were generated at the interface 32a between the first metal plate 14 and the ceramic substrate 12, were alleviated as a result of the fact that the member 18 was bonded to the front surface 14a of the first metal plate 14.

In contrast thereto, in Comparative Example 1, although cracks did not occur in any of the bonding layers 24, among the ten evaluation samples, cracks were generated in the ceramic substrate 102 in seven of the evaluation samples. Further, in Comparative Example 2, although cracks did not occur in any of the ceramic substrates 102, among the ten evaluation samples, cracks were generated in the bonding layer 24 in all ten of the evaluation samples.

Second Example

An evaluation as to the presence or absence of cracks in the bonding layer 24 and the ceramic substrate 12 was performed with respect to Inventive Examples 6 through 12. The results of this evaluation are shown in Table 2, which will be discussed below.

For the ceramic substrate 12, a silicon nitride ($Si_3N_4$) board was prepared having a thickness of 0.3 mm with a bending (flexural) strength of 650 MPa. The $Si_3N_4$ board exhibited the coefficient of thermal expansion of 3.1 ppm/K, and the Young's modulus of 330 GPa. For the first metal plate 14 and the second metal plate 16, an oxygen-free copper (Cu) plate was prepared. The oxygen-free Cu plate exhibited the coefficient of thermal expansion of 16.5 ppm/K, and the Young's modulus of 129.8 GPa. Further, an Ag—Cu type brazing material paste, to which there was added a Ti active metal powder, was prepared.

Example 6

For the member 18, an alumina ($Al_2O_3$) board was prepared having a thickness of 0.3 mm. The $Al_2O_3$ board exhibited the coefficient of thermal expansion of 7.2 ppm/K, and the Young's modulus of 310 GPa. An evaluation sample of a ceramic circuit board according to Example 6 included a structure similar to that of the second ceramic circuit board 10B shown in FIGS. 11A and 11B, as with the above-mentioned first embodiment. More specifically, an annular (ring-shaped) member 18 was used (denoted by the term "(annular arrangement)" in Table 2).

At first, a brazing material was coated at a thickness of 10 μm on the ceramic substrate 12 and the member 18, and Cu plates (the first metal plate 14 and the second metal plate 16) were bonded with the ceramic substrate 12 and the member 18. The thickness t1 of the first metal plate 14 was 2 mm, and the thickness t2 of the second metal plate 16 was 0.1 mm. The bonding conditions were such that heated pressure bonding was carried out under a vacuum at a temperature of 800° C. and a pressure of 1 MPa. Thereafter, as shown in FIGS. 17A and 17B, a power semiconductor 26 was bonded through a bonding layer 24 (in this case, a solder layer) to thereby obtain an evaluation sample according to Example 6. Ten of such evaluation samples were prepared.

Example 7

For the member 18, an alumina-zirconia ($Al_2O_3$—$ZrO_2$) board was prepared having a thickness of 0.3 mm. Otherwise, features thereof were the same as those of Example 6, and ten of such evaluation samples according to Example 7 were prepared. The $Al_2O_3$—$ZrO_2$ board contained 80% by mass $Al_2O_3$ and 20% by mass $ZrO_2$. The $Al_2O_3$—$ZrO_2$ board exhibited the coefficient of thermal expansion of 8.3 ppm/K, and the Young's modulus of 380 GPa.

Example 8

For the member 18, a silicon carbide (SiC) board was prepared having a thickness of 0.3 mm. Otherwise, features thereof were the same as those of Example 6, and ten of such evaluation samples according to Example 8 were prepared. The SiC board exhibited the coefficient of thermal expansion of 3.8 ppm/K, and the Young's modulus of 390 GPa.

Example 9

For the member 18, a zirconia ($ZrO_2$) board was prepared having a thickness of 0.3 mm. Otherwise, features thereof were the same as those of Example 6, and ten of such evaluation samples according to Example 9 were prepared. The $ZrO_2$ board exhibited the coefficient of thermal expansion of 10.5 ppm/K, and the Young's modulus of 200 GPa.

Example 10

For the member 18, a silicon (Si) board was prepared having a thickness of 0.3 mm. Otherwise, features thereof were the same as those of Example 6, and ten of such evaluation samples according to Example 10 were prepared. The Si board exhibited the coefficient of thermal expansion of 3.9 ppm/K, and the Young's modulus of 190 GPa.

Example 11

For the member 18, a tungsten (W) board was prepared having a thickness of 0.3 mm. Otherwise, features thereof were the same as those of Example 6, and ten of such evaluation samples according to Example 11 were prepared. The W board exhibited the coefficient of thermal expansion of 4.3 ppm/K, and the Young's modulus of 345 GPa.

Example 12

For the member 18, a tungsten-copper (W—Cu) board was prepared having a thickness of 0.3 mm. Otherwise, features thereof were the same as those of Example 6, and ten of such evaluation samples according to Example 12 were prepared. The W—Cu board contained 80% by mass W and 20% by mass Cu. The W—Cu board exhibited the coefficient of thermal expansion of 8.3 ppm/K, and the Young's modulus of 290 GPa.

<Evaluation>

In a similar manner to that of First Example, as an evaluation method, a heat cycle test was carried out over a temperature range of −40° C. to 125° C. The number of cycles was 100 cycles. Per each cycle, the temperature was held at −40° C. (low temperature) for 30 minutes and at 125° C. (high temperature) for 30 minutes. Upon completion of the heat cycle test, the occurrence ratio of cracks in the bonding layer 24, and the occurrence ratio of cracks in the ceramic substrate were evaluated. The evaluation results are shown in the following Table 2. In Table 2, the ratios are expressed by [The Number of Evaluation Samples in which Cracks were Generated)]/[The Evaluation Sample Parameter (=10)], as with Table 1.

TABLE 2

| | MATERIAL OF MEMBER (ANNULAR ARRANGEMENT) | COEFFICIENT OF THERMAL EXPANSION (ppm/K) | YOUNG'S MODULUS (GPa) | OCCURRENCE RATIO OF CRACKS IN BONDING LAYER | OCCURRENCE RATIO OF CRACKS IN CERAMIC SUBSTRATE |
|---|---|---|---|---|---|
| EXAMPLE 6 | $Al_2O_3$ | 7.2 | 310 | 0/10 | 0/10 |
| EXAMPLE 7 | $Al_2O_3$—$ZrO_2$ (20%) | 8.3 | 380 | 0/10 | 0/10 |
| EXAMPLE 8 | SiC | 3.8 | 390 | 0/10 | 0/10 |
| EXAMPLE 9 | $ZrO_2$ | 10.5 | 200 | 1/10 | 1/10 |
| EXAMPLE 10 | Si | 3.9 | 190 | 0/10 | 0/10 |

TABLE 2-continued

|  | MATERIAL OF MEMBER (ANNULAR ARRANGEMENT) | COEFFICIENT OF THERMAL EXPANSION (ppm/K) | YOUNG'S MODULUS (GPa) | OCCURRENCE RATIO OF CRACKS IN BONDING LAYER | OCCURRENCE RATIO OF CRACKS IN CERAMIC SUBSTRATE |
|---|---|---|---|---|---|
| EXAMPLE 11 | W | 4.3 | 345 | 0/10 | 0/10 |
| EXAMPLE 12 | W—Cu(20%) | 8.3 | 290 | 0/10 | 0/10 |

From Table 2, it can be understood that, among the evaluation samples according to Examples 6 to 12 except for Example 9, cracks were not generated in any of the bonding layers 24 and the ceramic substrates 12. This can be considered to have occurred because thermal stresses, which were generated at the interface 32a between the first metal plate 14 and the ceramic substrate 12, were alleviated as a result of the fact that the member 18 was bonded to the front surface 14a of the first metal plate 14.

In Example 9, although in one evaluation sample among the ten evaluation samples cracks were generated in the bonding layer 24 and the ceramic substrate 12, this stays at a practically acceptable level. The reason why cracks were generated only in Example 9 can be considered as follows. Among Examples 6 through 12, the $ZrO_2$ board of Example 9 exhibited the coefficient of thermal expansion which is the closest to that of the first metal plate 14 (16.5 ppm/K).

The ceramic circuit board and the electronic device according to the present invention are not limited to the aforementioned embodiments. Various alternative or additional structures may be adopted therein without deviating from the essential scope of the invention as set forth in the appended claims.

What is claimed is:

1. A ceramic circuit board comprising:
a ceramic substrate;
a first metal plate bonded to a front surface of the ceramic substrate, the first metal plate having a surface configured to be equipped with a power semiconductor;
a member bonded to a front surface side of the first metal plate; and
a second metal plate bonded to a rear surface of the ceramic substrate;
wherein an inequality $t2 < ta < t1$ is satisfied, where to represents a thickness of the ceramic substrate, t1 represents the thickness of the first metal plate, and t2 represents the thickness of the second metal plate, and
wherein the member is formed in an annular shape along an outer circumference of the front surface of the first metal plate, and the member is a component different from the power semiconductor, and
wherein the member is made from a material which exhibits a lower coefficient of thermal expansion than that of the first metal plate, and which exhibits a higher Young's modulus than that of the first metal plate.

2. The ceramic circuit board according to claim 1, wherein a plurality of the members are provided, the plural members being arranged along an outer circumference of the front surface of the first metal plate.

3. The ceramic circuit board according to claim 1, wherein two of the members are bonded at linearly symmetric positions.

4. The ceramic circuit board according to claim 1, wherein a portion of the member extends out in a transverse direction beyond an outer circumference of the front surface of the first metal plate.

5. The ceramic circuit board according to claim 1, wherein an entirety of the member is bonded within the front surface of the first metal plate.

6. The ceramic circuit board according to claim 1, wherein:
a portion of the front surface of the first metal plate includes a recess therein; and
the member is bonded in the recess.

7. The ceramic circuit board according to claim 1, wherein at least material properties and thicknesses of the member and the ceramic substrate are adjusted so as to suppress warping of the ceramic circuit board.

8. The ceramic circuit board according to claim 1, wherein a constituent material of the member is a ceramic material, which is the same as the ceramic material of the ceramic substrate.

9. The ceramic circuit board according to claim 1, wherein the constituent material of the ceramic substrate is silicon nitride.

10. An electronic device comprising:
a ceramic circuit board; and
a power semiconductor, which is mounted on a front surface of a first metal plate of the ceramic circuit board,
the ceramic circuit board comprising:
a ceramic substrate;
the first metal plate bonded to a front surface of the ceramic substrate;
a member bonded to a front surface side of the metal plate; and
a second metal plate bonded to a rear surface of the ceramic substrate;
wherein an inequality $t2 < ta < t1$ is satisfied, where to represents a thickness of the ceramic substrate, t1 represents the thickness of the first metal plate, and t2 represents the thickness of the second metal plate, and
wherein the member is formed in an annular shape along an outer circumference of the front surface of the first metal plate, and the member is a component different from the power semiconductor, and
wherein the member is made from a material which exhibits a lower coefficient of thermal expansion than that of the first metal plate, and which exhibits a higher Young's modulus than that of the first metal plate.

\* \* \* \* \*